(12) United States Patent
Okamoto et al.

(10) Patent No.: US 8,960,927 B2
(45) Date of Patent: Feb. 24, 2015

(54) COHERENT LIGHT SOURCE APPARATUS AND PROJECTOR

(71) Applicant: Ushio Denki Kabushiki Kaisha, Tokyo (JP)

(72) Inventors: Masashi Okamoto, Hyogo (JP); Takahiro Toma, Hyogo (JP); Yuichi Miura, Hyogo (JP); Mikio Shimizu, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 231 days.

(21) Appl. No.: 13/722,343

(22) Filed: Dec. 20, 2012

(65) Prior Publication Data

US 2013/0162955 A1 Jun. 27, 2013

(30) Foreign Application Priority Data

Dec. 27, 2011 (JP) ................. 2011-284601

(51) Int. Cl.
*G03B 21/14* (2006.01)
*G03B 21/20* (2006.01)
*G02B 27/48* (2006.01)
*G02F 1/29* (2006.01)
(Continued)

(52) U.S. Cl.
CPC .............. *G02F 1/29* (2013.01); *G03B 21/14* (2013.01); *H01S 3/005* (2013.01); *G02B 27/48* (2013.01);
(Continued)

(58) Field of Classification Search
CPC ...... G03B 21/14; G03B 21/147; G03B 21/20; G03B 21/2013; G03B 21/2033; G03B 21/2046; G03B 21/2066; G03B 21/208; G03B 33/06; G03B 33/08; H04N 9/3111; H04N 9/31; H04N 9/3129; H04N 9/3135; H04N 9/3161; G02B 27/48; G02B 19/0057; H01S 5/005; H01S 5/4012; H01S 5/4093; H01S 3/005; G02F 1/29
USPC ........ 353/30–31, 85, 94, 98, 102, 122; 372/9, 372/24; 362/259, 553
See application file for complete search history.

(56) References Cited

U.S. PATENT DOCUMENTS 6,773,120 B2 * 8/2004 Colpaert ........................ 353/122
7,413,311 B2 * 8/2008 Govorkov et al. .............. 353/34
(Continued)

FOREIGN PATENT DOCUMENTS

| JP | 59-024823 A | 2/1984 |
| JP | 10-133303 A | 5/1998 |

(Continued)

*Primary Examiner* — Tony Ko
*Assistant Examiner* — Jori S Reilly-Diakun
(74) *Attorney, Agent, or Firm* — Rader, Fishman & Grauer PLLC

(57) ABSTRACT

A coherent light source apparatus includes a coherent light source, a first optical system, a light deflection unit, a second optical system and a light mixing unit disposed in that order. The coherent light source forms a first light emission region, and light projected therefrom forms a second light emission region near the light deflection unit, which deflects light flux from the second light emission region. The second optical system forms a third light emission region which is conjugate to the second light emission region near an input end of the light mixing unit, which mixes angle and a position components of incident light. The light deflection unit is configured to continuously changing a direction in which the light flux is deflected, thereby reducing speckling in light emitted from the light mixing unit.

13 Claims, 12 Drawing Sheets

(51) Int. Cl.
*H01S 3/00* (2006.01)
*G02B 19/00* (2006.01)
*H04N 9/31* (2006.01)
*H01S 5/00* (2006.01)
*H01S 5/40* (2006.01)
*G03B 33/06* (2006.01)
*G03B 33/08* (2006.01)

(52) U.S. Cl.
CPC ........ *G03B 21/2013* (2013.01); *G03B 21/2033* (2013.01); *G03B 21/2066* (2013.01); *G03B 21/208* (2013.01); *G02B 19/0057* (2013.01); *H04N 9/3111* (2013.01); *H04N 9/3161* (2013.01); *H01S 5/005* (2013.01); *H01S 5/4012* (2013.01); *H01S 5/4093* (2013.01); *G03B 33/06* (2013.01); *G03B 33/08* (2013.01)
USPC ................ 353/85; 353/94; 372/9; 362/259

(56) References Cited

U.S. PATENT DOCUMENTS

| | | | | |
|---|---|---|---|---|
| 7,695,145 | B2 * | 4/2010 | Kojima et al. | 353/101 |
| 7,719,737 | B2 * | 5/2010 | Amada et al. | 359/196.1 |
| 7,993,005 | B2 * | 8/2011 | Peterson | 353/30 |
| 8,469,515 | B2 * | 6/2013 | Yamauchi et al. | 353/20 |
| 8,562,139 | B2 * | 10/2013 | Seki | 353/31 |
| 2004/0227806 | A1 * | 11/2004 | Takakubo | 347/241 |
| 2013/0162955 | A1 * | 6/2013 | Okamoto et al. | 353/30 |
| 2013/0335710 | A1 * | 12/2013 | Okamoto et al. | 353/30 |

FOREIGN PATENT DOCUMENTS

| | | |
|---|---|---|
| JP | 2001-142141 A | 5/2001 |
| JP | 2004-252112 A | 9/2004 |

* cited by examiner

COHERENT LIGHT SOURCE APPARATUS AND PROJECTOR

CROSS-REFERENCES TO RELATED APPLICATION

This application claims priority from Japanese Patent Application Serial No. 2011-284601 filed Dec. 27, 2011, the contents of which are incorporated herein by reference in its entirety.

TECHNICAL FIELD

The present invention relates to a coherent light source apparatus using a coherent light source such as a laser, which can be used in, for example, an optical device such as a projector.

BACKGROUND

For example, in a projector for image display such as a DLP™ projector and a liquid crystal projector and a photo mask exposure apparatus, a high intensity discharge lamps (HID lamp) such as a xenon lamp and an extra-high pressure mercury lamp has been used so far. As an example, the principle of such a projector is shown in FIG. 17 (reference: Japanese Patent Application Publication No. 2004-252112 etc.).

As described above, light from a light source (Spa), which is made up of a high intensity discharge lamp etc., is inputted into an incident end (PmiA) of a light homogenizing unit (FmA), and is outputted from an emission end (PmoA) by, for example, using a condensing unit (not shown), which is made up of a concave reflection mirror, a lens, etc. Here, for example, an optical guide can be used as the light homogenizing unit (FmA), which is also called a rod integrator, a light tunnel, etc., and may be formed of a prism, which is made from light transmittant material such as glass, resin, etc. In such an light homogenizing unit (FmA) the light inputted into the incident end (PmiA) is repeatedly and totally reflected on a side face of the light homogenizing unit (FmA) according to the same principle as that of an optical fiber, and the light propagates inside the light homogenizing unit (FmA) such that the illuminance on the emission end (PmoA) is sufficiently homogenized even if distribution of the light inputted into the incident end (PmiA) has unevenness.

Although, in the above description, the optical guide is formed by a prism, which is made from light transmittant material such as glass, resin, etc., it may be formed of a hollow prism in which the inside thereof is formed of a reflection mirror such that a reflection light is repeated on an inner face similarly and the light propagates therein so that a similar function thereto is achieved.

An illumination lens (Ej1A) is arranged so that a quadrangle image of the emission end (PmoA) is formed on a two-dimensional light amplitude modulation element (DmjA), whereby the two-dimensional light amplitude modulation element (DmjA) is illuminated by light outputted from the emission end (PmoA). However, in FIG. 17, a mirror (MjA) is arranged between the illumination lens (Ej1A) and the two-dimensional light amplitude modulation element (DmjA). And the two-dimensional light amplitude modulation element (DmjA) modulates light on a pixel to pixel basis according to an image signal so that the light is directed so as to enter the projection lens (Ej2A), or light is directed so as not to enter there, whereby an image is displayed on a screen (Tj).

Incidentally, the above-described two-dimensional light amplitude modulation element is also called a light valve, and in the case of the optical system shown in FIG. 17, a DMD™ (Digital Micromirror Device) is generally used as the two-dimensional light amplitude modulation element (DmjA).

The so-called fly eye integrator may also be used as the light homogenizing unit, instead of the above-described optical guide. FIG. 18 shows the principle of a projector using this light homogenizing unit, as an example (reference: Japanese Patent Application Publication No. 2001-142141 etc.).

Light from a light source (SjB), which is made up of a high intensity discharge lamp etc., is inputted, as approximately parallel light flux, into an incident end (PmiB) of the light homogenizing unit (FmB), which is made up of a fly eye integrator, and is outputted from an emission end (PmoB), by using a collimator unit (not shown), which is made up of a concave reflection mirror, a lens, etc. Here, the light homogenizing unit (FmB) is made up of a combination of an upstream fly eye lens (F1B) on an incident side, a downstream fly eye lens (F2B) on a light emission side, and an illumination lens (Ej1B). The upstream fly eye lens (F1B) and the downstream fly eye lens (F2B) are respectively formed by arranging, in vertical and horizontal directions, many quadrangle lenses whose focal distance is the same as one another and whose shape is the same as one another.

Each lens of the upstream fly eye lens (F1B), and each lens of the downstream fly eye lens (F2B) which corresponds to and is located downstream of each lens of the upstream fly eye lens (F1B), form a optical system called Koehler illumination, so that many Koehler illumination optical systems are aligned in a matrix in a plane. Generally, such a Koehler illumination optical system is made up of two lenses, wherein when an upstream fly eye lens collects light and illuminates an object face (face to be illuminated), the upstream lens does not form an image of a light source on the object face, but forms an image of the light source on a center face of a downstream lens, whereby the object face is uniformly illuminated by arranging the downstream lens so as to form a quadrangle contour image of the upstream fly eye lens on the object face. The downstream lens functions so as to prevent a phenomenon in which an illuminance of a circumference part of the quadrangle object face falls depending on the size, if the downstream lens is not provided and a light source is not a perfect point light source but has a limited size, whereby it is possible to form a uniform illuminance on even the circumference part of the quadrangle object face by the downstream lens, independent of the size of the light source.

Here, since the optical system shown in FIG. 18 is configured based on approximately parallel light flux, which is inputted into the light homogenizing unit (FmB), an interval between the upstream fly eye lens (F1B) and the downstream fly eye lens (F2B) is set so as to become equal to those focal distances, so that an image of the object face of the uniform illumination of a Koehler illumination optical system is formed at infinity. However, since an illumination lens (Ej1B) is arranged downstream of the downstream fly eye lens (F2B), the object face can be pulled near on the focal plane of the illumination lens (Ej1B) from the infinity. Since the Koehler illumination optical systems arranged in a matrix in a plane are parallel to an incident light axis (ZiB) and light flux is approximately axisymmetrically inputted therein with respect to each central axis so that the output light flux is also approximately axisymmetrical, and outputs of all the Koehler illumination optical systems are imaged on the same object face on the focal plane of the illumination lens (Ej1B) because of the nature of lens, i.e., a Fourier transform of a lens, in which light rays entering a lens face at the same angle as one another, are refracted so as to be directed to the same point on a focal plane without depending on the incidence position on the lens face.

As a result, all the illuminance distributions in each lens face of the upstream fly eye lens (F1B) are overlaid, so that one synthesized quadrangle image, whose illuminance distribution is more uniform than that in case of one Koehler illumination optical system, is formed on the incident light axis (ZiB). The two-dimensional light amplitude modulation element (DmjB), which is an illumination object, is illuminated by light outputted from the emission end (PmoB) when a two-dimensional light amplitude modulation element (DmjB) is arranged at a position of the synthesized quadrangle image. However, the light is reflected towards the two-dimensional light amplitude modulation element (DmjB) in case of illumination, by arranging a polarization beam splitter (MjB) between the illumination lens (Ej1B) and the two-dimensional light amplitude modulation element (DmjB). And the two-dimensional light amplitude modulation element (DmjB) performs a modulation and reflection so as to or so as not to rotate the polarization direction of light by 90 degrees on a pixel to pixel basis according to an image signal, whereby only the rotated light passes through the polarization beam splitter (MjB), and enters the projection lens (Ej3B), so that an image may be displayed on a screen (Tj).

In addition, in the case of the optical system shown in FIG. 18, in general, a LCOS™ (Liquid Crystal on Silicon) is used as the two-dimensional light amplitude modulation element (DmjA) in many cases. In the case of such a liquid crystal device, since only a component of light in a specified polarization direction can be modulated effectively, although a component parallel to the specified polarization direction is usually passed therethrough as it is, only a component perpendicular to the specified polarization direction is rotated by 90 degrees with respect to the polarization direction, so that the polarized-light alignment functional device (PcB) for making all the light effectively usable is inserted, for example, downstream of the downstream fly eye lens (F2B). Moreover, a field lens (Ej2B) is inserted immediately upstream of the two-dimensional light amplitude modulation element (DmjB) so that approximately parallel light may enter the two-dimensional light amplitude modulation element (DmjB).

In addition to the reflection type of the two-dimensional light amplitude modulation element shown in FIG. 18, a transmissive liquid crystal device (LCD) may be used as the two-dimensional light amplitude modulation element in the optical arrangement which is suitable therefor (reference: Japanese Patent Application Publication No. H10-133303 etc.).

Generally, for example, a dynamic color filter such as a color wheel is arranged downstream of the light homogenizing unit in a projector in order to display a color image, and the two-dimensional light amplitude modulation element is illuminated with color sequential light flux of R, G and B (Red, Green, Blue), whereby color display is realized in time dividing manner, or a dichroic mirror or a dichroic prism is arranged downstream of the light homogenizing unit, so that the two-dimensional light amplitude modulation element, which is independently provided in each color, is illuminated with light which is separated into the three primary colors of R, G and B, and a dichroic mirror or a dichroic prism for performing color synthesis of the modulated light flux of the primary colors R, G and B is arranged. However, for ease of explanation, in FIGS. 17 and 18, these elements are omitted.

However, the high intensity discharge lamp has drawbacks such as low conversion efficiency from applied power to light power, i.e., great heat generation and/or a short life span. A solid light source such as an LED and a semiconductor laser attracts attention in recent years as an alternative light source, in which these drawbacks are solved. Although of these light sources, in the LED, heat generation thereof is small and an operating life span thereof is long as compared with those of the discharge lamp, since there is no directivity of light emitted therefrom as in such a discharge lamp, there is a problem that the usage efficiency of light is low when it is used in the above-mentioned projector or exposure apparatus, in which only light in specific direction can be used. On the other hand, a semiconductor laser has high directivity in addition to a small heat generation and a long operating life spam as in such an LED, so that there is an advantage that the usage efficiency of light is high, when it is used in the above-mentioned projector, exposure apparatus, etc. in which only light in a specific direction can be used. However, in such a semiconductor laser, there is a problem that a speckle occurs. Here, the term "speckle" means a spotty or patchy pattern which inevitably appears when projecting semiconductor laser light, or other laser or coherent light, which is generated by performing wavelength conversion of laser light (using nonlinear optical phenomena, such as a harmonic generation and an optical parametric effect). Since the speckle is a very troublesome phenomenon because of remarkably degrading image quality for use in the above-mentioned projector for watching an image, or for use in precise exposure of a pattern of a photomask on a film, which is made up of photosensitive material, many devices for an improvement thereof have been proposed for many years.

For example, Japanese Patent Application Publication No. S59-024823 discloses an influence elimination apparatus for eliminating a speckle of an output light of an optical fiber, wherein an optical element, by which a relative relation between an input end surface of the optical fiber and a laser light beam is changed in time, is provided on an optical path of a laser beam, which is generated by condensing laser light so as to input the laser beam into an input end surface of an optical fiber. The publication illustrates an example where a position of a spot, at which laser light beam is condensed, is changed in an oscillating manner within a predetermined range on an input end face of an optical fiber, as one of forms for changing in terms of time the relation between the input end face of the optical fiber and the laser light beam, and it gives an embodiment of a concrete optical system structure using an ultrasonic diffraction element, a deflecting mirror (galvanometer), an oscillating mirror, and a rotation non-parallel glass plate. In addition, the publication illustrates an example of another form for changing the relative relation between an input end face of an optical fiber and a laser light beam in terms of time where an angle of a central axis of a laser light beam to be condensed is changed in an oscillating manner within a predetermined range although a position of a spot, at which a laser light beam is condensed, is not changed on an input end face of an optical fiber. However, it does not show any embodiment of a concrete structure of an optical system.

SUMMARY

It is an object of the present invention to offer a coherent light source and a projector for avoiding a problem that the uniformity of light to be projected is deteriorated due to a speckle, which inevitably appears when projecting semiconductor laser light, other laser or coherent light generated by performing wavelength conversion of laser light.

A coherent light source apparatus according to a first exemplary embodiment, comprises: a first optical system (Eu) which has a first light emission region (Gs) formed by a coherent light source (Sc), and projects light from the first light emission region (Gs) so as to form a second light emission region (Gu); a light deflection unit (Md), which deflects light flux (Bu) relating to formation of the second light emission region (Gu) near the second light emission region (Gu); a second optical system (Ef), which is installed downstream of the light deflection unit (Md), and forms a third light emission region (Gf), which is conjugate to the second light emission region (Gu); and a light mixing unit (Fm) installed downstream of the second optical system (Ef), for mixing angle and position components of incident light, wherein an input end (Pmi) thereof is provided near the third light emission region (Gf), wherein the light deflection unit (Md) continues an operation for continuously changing a direction in which the light flux (Bu) is deflected.

In the coherent light source apparatus according to a second exemplary embodiment, the light mixing unit (Fm) may be an optical guide which guides waves while confining light in a predetermined space and carrying out multiple reflection of the light.

In the coherent light source apparatus according to the third exemplary embodiment, the light mixing unit (Fm) may be a fly eye integrator.

The coherent light source apparatus according to a fourth exemplary embodiment, the first light emission region (Gs) may be made up of two or more or a distributed radiant points (Ks, Ks', --), and principal rays (Lps, Lps', --) of light flux which form the respective radiant points (Ks, Ks', --) of the first light emission region (Gs) are made approximately parallel to each other, after passing through the second optical system (Ef).

In the coherent light source apparatus according to a fifth exemplary embodiment, the first light emission region (Gs) may be made up of two or more or distributed radiant points (Ks, Ks', --), and principal rays (Lps, Lps', --) of light flux which form respective radiant points (Ks, Ks', --) of the first light emission region (Gs) pass through near a center of the third light emission region (Gf), after passing through the second optical system (Ef).

In the coherent light source apparatus according to a sixth exemplary embodiment, the radiant points (Ks, Ks', --) in the first light emission region (Gs) may be arranged or distributed so that a shape of the third light emission region (Gf) which forms the second optical system (Ef) may fit in a shape of the incident end (Pmi) of the light mixing unit (Fm).

The coherent light source apparatus according to a seventh exemplary embodiment, the first light emission region (Gs) may be formed by an emission end (Pto) of an optical fiber (Fb) where light of a coherent light source (Sc) is inputted from the incident end thereof.

A projector according to an eight exemplary embodiment of the present invention may use the coherent light source apparatus according to any one of the first through eight embodiments, whereby an image may be projected and displayed, wherein the light homogenizing unit may serve as the light mixing unit (Fm).

According to the present invention, it is possible to offer a coherent light source and a projector for avoiding a problem that the uniformity of light to be projected is deteriorated due to a speckle, which inevitably appears when projecting semiconductor laser light, other laser or coherent light, which is generated by performing wavelength conversion of laser light.

BRIEF DESCRIPTION OF THE DRAWING

Other features and advantages of the present coherent light source apparatus and projector will be apparent from the ensuing description, taken in conjunction with the accompanying drawings, in which.

DESCRIPTION

A term "conjugate" in an explanation of the present invention is used in the geometric optics field, and, for example, "when A and B are conjugate to each other", it means that A is imaged on B or B is imaged on A by an action of an optical element such as a lens having an image formation function, based on at least the paraxial theory. Here, A and B are images and include, as objects, not only an isolated point image but also a set of a plurality of point images or a spread image made up of continuously distributed point images.

Here terms "point image" or "image point (that is, "image")" is used in the geometric optics field, and includes any one of the following cases: (1) where light is actually emitted from the point, (2) where light converges toward the point, a bright point can be viewed at the point if a screen is placed on the point, (3) where light looks like converging toward the point (however, the point is located inside an optical system, so that a screen cannot be placed on the point to view a bright point), and (4) where light is viewed as if the light is emitted from the point (however, the point is located inside an optical system, so that a screen cannot be placed on the point within the optical system to view a bright point) and they are not distinguished from one another. Moreover, phenomena where an image is blurred due to aberration in image formation or out-of-focus etc. and an ideal point or a diffraction limit image can no longer be formed, are ignored.

Moreover, a term "light emission region" includes the following cases: where the above-mentioned image may be included in a space or on a face which emits light or is irradiated with light, and similarly, where light is actually emitted from the region, where a bright region is reflected when light converges toward that region and a screen is placed, where light is viewed so that light converges toward the region (however, the region is located inside an optical system, so that a screen cannot be placed therein), and where light is viewed so that light is emitted from the region (however, the region is located inside an optical system, so that a screen cannot be place therein) and they are not distinguished from one another. Furthermore, a term "radiant point" means an image point, which forms a light emission region or a small light emission region which can be substantially converged to approximately the diffraction limit.

Figure 1:
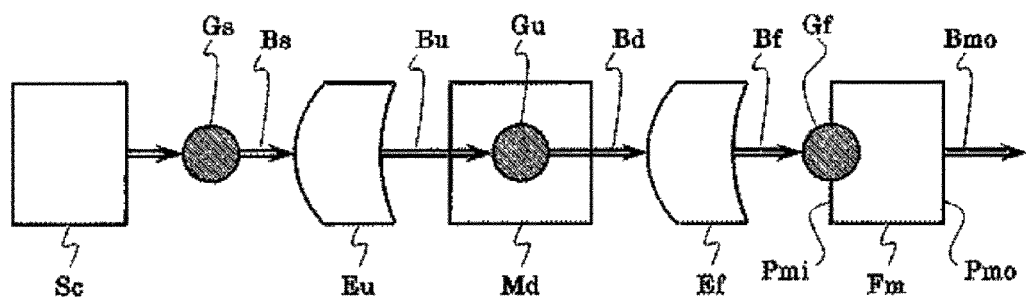
FIG. 1 is a schematic block diagram showing a coherent light source apparatus.

Description of a coherent light source apparatus according an exemplary embodiment of the present invention will be given below referring to FIG. 1, which is a schematic block diagram showing the present coherent light source apparatus. For example, when a coherent light source (Sc) shown in FIG. 1 is a semiconductor laser, a radiant section of diverging light, which exists on a surface of a semiconductor chip accommodated inside the semiconductor laser package, can be substantially treated as a point light source, so that this can be used as a first light emission region (Gs).

The first optical system (Eu), which is made up of a lens etc., receives an input of light flux (Bs) from the first light emission region (Gs), and is arranged so that a second light emission region (Gu) may be formed near a deflection point of a downstream light deflection unit (Md) as a projection region to the first light emission region (Gs). That is, the light deflection unit (Md) deflects the light flux (Bu) in connection with formation of the second light emission region (Gu), at the deflection point near the second light emission region (Gu).

A second optical system (Ef), which is made up of a lens etc., is arranged so as to receive an input of the light flux (Bd) deflected by the light deflection unit (Md), and to form a third light emission region (Gf) as an image, which is conjugate to the second light emission region (Gu), near an incident end (Pmi) of a downstream light mixing unit (Fm). However, as described above, what is meant by the second light emission region (Gu) and the third light emission region (Gf) being conjugate to each other, is that the third light emission region (Gf) is formed as an output image by an image formation function of the second optical system (Ef), whose input image is an image of the second light emission region (Gu).

Light flux (Bf) from the second optical system (Ef) is inputted into a light mixing unit (Fm) through the incident end (Pmi), wherein angle and position components of the incident light are mixed inside the light mixing unit (Fm), and light flux (Bmo) is outputted from an emission end (Pmo). In the outputted light flux (Bmo), as a result of multiple interferences caused by mixture of the angle and position components of incident light, a spotty or patchy pattern of the speckle projected on an illumination face becomes fine so that a characteristic in which it becomes difficult to be seen, is given to the light flux (Bmo).

The second light emission region (Gu) formed by the light flux (Bu) remains immovable regardless of the deflection operation of the light deflection unit (Md). In addition, since the second light emission region (Gu) is located near the deflection point of the light deflection unit (Md), the light emission region that is the origination of the light flux (Bd) deflected by the light deflection unit (Md) also hardly moves. And since the second light emission region (Gu) and the third light emission region (Gf) are conjugate to each other, the third light emission region (Gf) remains almost unmovable, whereby even if the deflection operation of the light deflection unit (Md) is performed, the state, where the light flux (Bf) enters the incident end (Pmi) of the light mixing unit (Fm), is always maintained.

Figure 2:
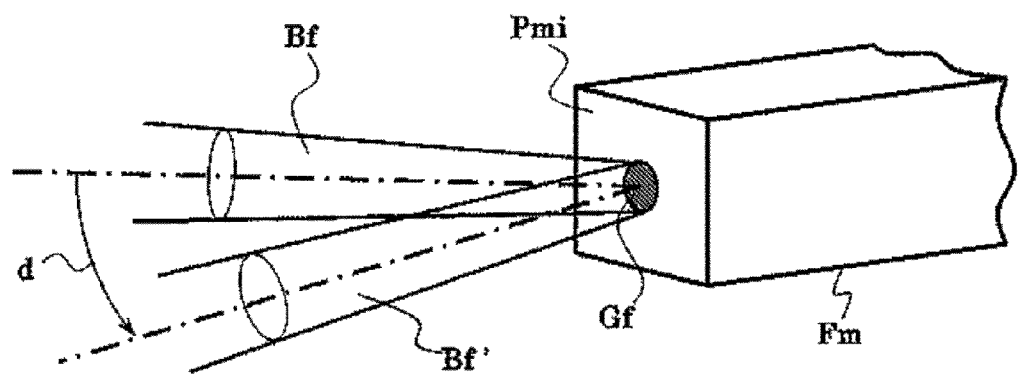
FIG. 2 is a schematic diagram showing part of a coherent light source apparatus.

FIG. 2 is a pattern diagram showing such a state. It shows a state where even if the light flux (Bf) turns into light flux (Bf') by the deflection operation shown by an arrow (d), the third light emission region (Gf) on the incident end (Pmi) of the light mixing unit (Fm) remains unmovable.

Therefore, under the conditions where light propagates inside the light mixing unit (Fm), which are determined by the structure of the light mixing unit (Fm), the amount of the light flux (Bmo) emitted from the emission end (Pmo) of the light mixing unit (Fm) can be made so as not to depend on the deflection angle of the light deflection unit (Md), that is, brightness can be made constant, by setting the deflection angle range of the light deflection unit (Md) to a suitable value, so that light rays, which deviate and exceed these conditions depending on the deflection angle, may not be generated more than a tolerance limit.

On the other hand, since the mixture state of the angle and position components of incident light on the incident end (Pmi) is continuously changed, by continuing the operation of the light deflection unit (Md), in which the deflection direction of the light flux (Bu) is continuously changed, a speckle may always move in the light flux (Bmo) emitted from the emission end (Pmo) of the light mixing unit (Fm). Therefore, if it is averaged within a suitable period corresponding to the movement speed, the above-mentioned spotty or patchy pattern of the speckle becomes fine, so that the speckle becomes invisible, synergistically working with the effect that it becomes difficult to be viewed.

In addition, a degree of unmovability of the light emission region, which is the origination of the light flux (Bd) deflected by the light deflection unit (Md), depends on an approximate degree of the second light emission region (Gu) to the deflection point of the light deflection unit (Md). In other words, the closer the second light emission region (Gu) is to the deflection point of the light deflection unit (Md), the greater the degree of immovability of the light emission region that originates the light flux (Bd). Moreover, a degree of unmovability of the third light emission region (Gf) on the incident end (Pmi) of the light mixing unit (Fm) depends on both a degree of unmovability of the light emission region, which is the origination of the light flux (Bd) deflected by the light deflection unit (Md), and an approximate degree of the incident end (Pmi) of the light mixing unit (Fm) to the third light emission region (Gf) being formed near the incident end (Pmi), and furthermore, depends on the aberration of the second optical system (Ef). In other words, the degree of immovability of the third light emission region (Gf) depends on the degree of immovability of the light emission region that originates the light flux (Bd) and the aberration of the second optical system (Ef). Because movement of the third light emission region (Gf) off the incident end (Pmi) results in decreased light usage efficiency, it is desirable to confine the degree of immovability of the third light emission region (Gf) within a range in which such inefficiency is avoided.

As long as the angle and position components of incident light are mixed so as to be emitted when light enters the light mixing unit (Fm), various means may be used as the light mixing unit (Fm). As a simple example, especially an optical guide, which guides waves while confining light in a predetermined space and carrying out multiple reflection of the light, can be used.

Figure 17:
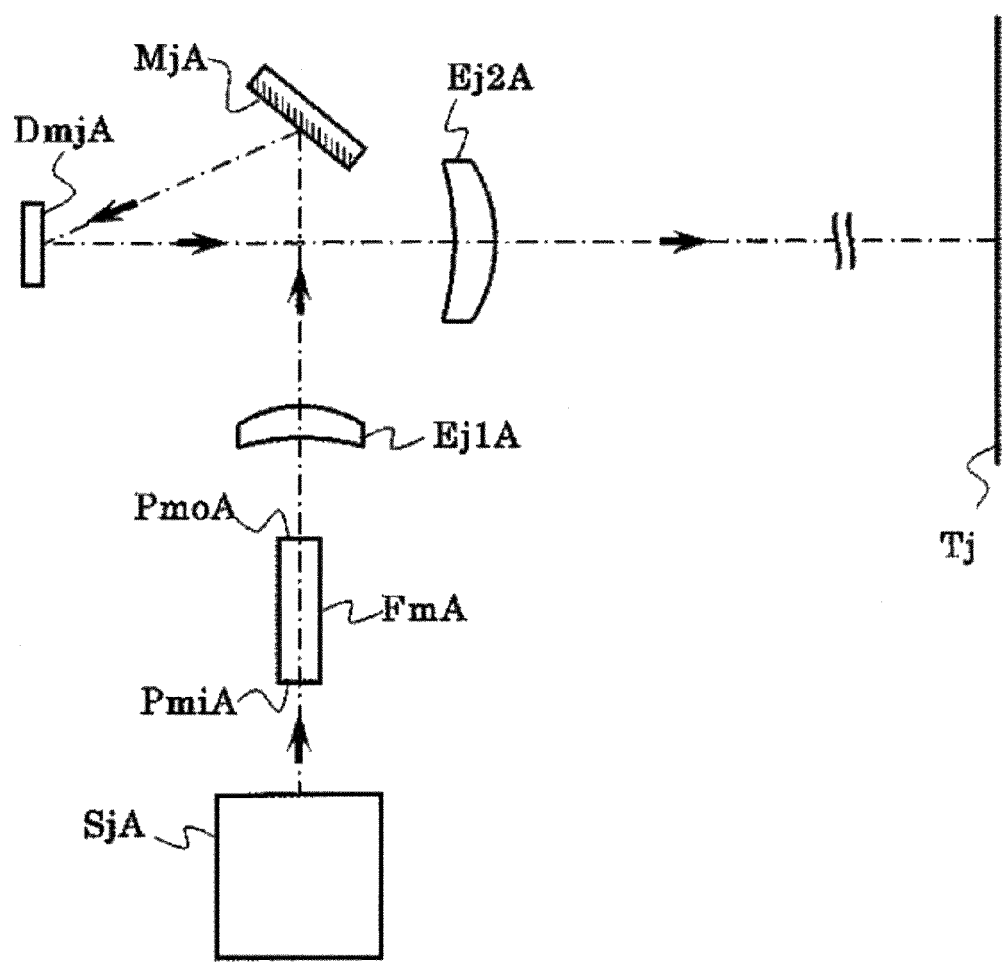
FIG. 17 is a principle diagram for explaining one form of part of one kind of a projector.

The optical guide is also called a rod integrator, a light tunnel, etc., as described above in conjunction with FIG. 17. The optical guide may be formed by a prism, which is made from light transmittant material such as glass, resin, etc., and according to the same principle as an optical fiber, light inputted into the incident end (Pmi) repeatedly fully reflected on an side face of the light mixing unit (Fm), so as to propagate inside the light mixing unit (Fm), whereby the angle and position components of the incident light are mixed. In addition to the optical guide in the shape of prism, which is made of light transmittant material such as glass and resin etc., the optical guide may also be formed of a hollow prism in which the inside thereof is formed of a reflection mirror, wherein similarly while a reflection of light is repeated on an inner face thereof, light propagates therein so that a similar function thereto is achieved.

The reason why the angle and position components of incident light are mixed by guiding waves while confining the light in a predetermined space and carrying out multiple reflection of the light in this way, is that when multiple reflection is repeated and light propagates over the full length of the light mixing unit (Fm), very many wave sources must be viewed according to the principle of a kaleidoscope if it is viewed from the emission end (Pmo), so that the light from the very many wave sources reaches the emission end (Pmo) thereby becoming equivalent to an emission status thereof.

Figure 18:
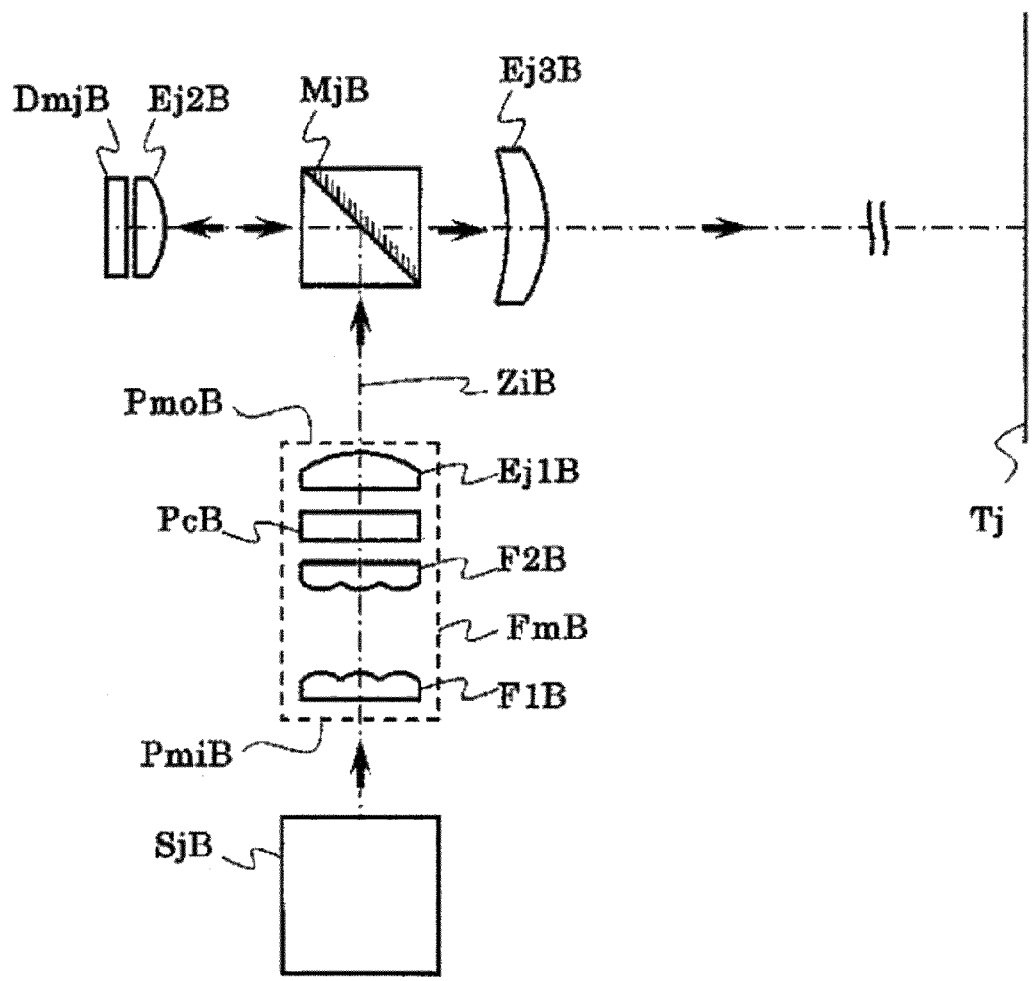
FIG. 18 is a principle diagram for explaining one form of part of one kind of a projector

Furthermore, a fly eye integrator similar to one, which is previously described with respect to FIG. 18, can be used as the light mixing unit (Fm). The reason why the angle and position components of the incident light is mixed by using such a fly eye integrator, is that, as described above, in the fly eye integrator, since all the quadrangle contour images of the respective lenses aligned in vertical and horizontal directions on the fly eye lens, which is on an incident side, are overlaid at one place, a kaleidoscope-like state appears as in the case of the above-mentioned optical guide, so that the light from very many wave sources reaches an object to be illuminated simultaneously.

In addition, when such a fly eye integrator is used as the light mixing unit (Fm), it is desirable that the third light emission region (Gf), which is formed near the incident end (Pmi), be formed as an illumination region, which stretches out over the entire region of the incident end (Pmi). This is because when the third light emission region (Gf) enters only part of the fly eye lens of the incident end (Pmi), the number of the quadrangle lens contour images to be overlaid becomes small and an action of mixture of the angle and position components of incident light becomes weaker.

On the other hand, in the case where the above-mentioned optical guide is used as the light mixing unit (Fm), light may enter there, in a form of, for example, a point image, which is concentrated on one or more places of the incident end (Pmi), or two or more places. This is because the angle and position components of the incident light are fully mixed when light flux spreads while propagating in the optical guide and reaches the emission end (Pmo), if an image formation spread angle of the point image is suitable.

In the above illustrated case where the coherent light source (Sc) is a semiconductor laser, if the number of semiconductor lasers is one, the first light emission region (Gs) is considered as only one point light source, and usually, it is placed on the optical axis of the optical system, and is arranged so as to be directed so that the central ray of distribution of diffusing light in a diffusing direction from the semiconductor laser may coincide with an optical axis. However, in the case where two or more semiconductor lasers are provided or in the case of a light source from which a radiant point is continuously distributed in a limited area, a design in which an entrance pupil and an exit pupil of an optical system, and the principal ray are taken into consideration, is needed, and such a situation is described below.

Taking a general camera lens for an example, although an aperture stop usually exists inside a lens, an image of the aperture stop, which can be seen through the lens when seen from a side where light enters, is called an entrance pupil, and an image of the aperture stop, which can be seen through the lens when seen from a side where light is emitted, is called an exit pupil. In addition, a meridional ray, which goes toward the center of the entrance pupil or comes out from the center of an exit pupil, is called a principal ray. Moreover, rays other than the principal ray are in a broad sense called marginal rays. However, in an optical system for treating light, which has directivity as in the laser, no aperture stop is provided in many cases since there may be no necessity of extracting light flux by such an aperture stop. In such case, they are defined based on a form of light existence in an optical system.

Usually, when the central ray of the optical direction distribution in the radiation light flux from a radiant point is defined as a principal ray, an entrance pupil is located at the position where the principal ray, which enters an optical system, or an extension thereof, intersects with an optical axis, and an exit pupil is located at a position where the principal ray emitted from the optical system or an extension thereof intersect with the optical axis. However, in a precise sense, there may be cases where the principal ray defined in such a manner and the optical axis do not intersect with each other because of, for example, an adjustment error, so that they are merely at a skew position to each other. However since such a phenomenon is not related to the essence thereof, so that there is no point in discussion thereof, in an explanation set forth below, it is assumed that such a phenomenon does not occur, or they intersect with each other at a position where the principal ray and the optical axis are closest to each other. Moreover, where two adjoining partial optical systems A and B in the optical system are observed, when B adjoins A immediately downstream thereof, the exit pupil of A turns into an entrance pupil of B (similarly to the case where an output image of A turns into an input image of B), and all the entrance pupil and the exit pupil of the partial optical system, which are arbitrarily defined in the optical system, (if there is an aperture stop, it is an image thereof, and even though it does not exist, they) must be conjugate with each other, so if no distinction therebetween is specifically needed, the entrance pupil and the exit pupil will be merely called a pupil.

Although the optical axis of the optical system is called a z axis in the explanation and the drawing of the present invention, a direction, in which light rays propagating along the original z axis are reflected, is also called a z axis when the optical axis is bent by a reflection mirror, so that a new axis coordinates are not used. However, as to the light deflection unit (Md), the center of distribution in a direction (a zf axis, which is described below) where the rays propagate along the z axis before it is deflected and propagates, is defined as a z axis after it is deflected. In addition, for convenience, in drawings such as FIG. 3, it is shown as an x-axis or a y-axis, which is an axis perpendicular to the z axis.

Figure 3:
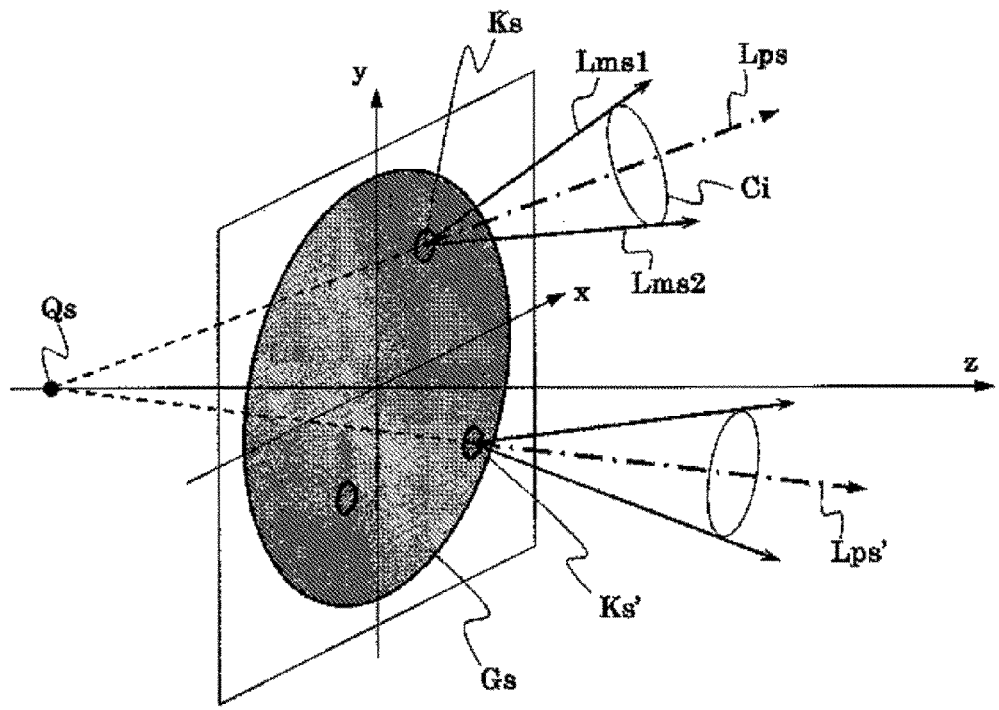
FIG. 3 is a conceptual diagram showing part of a coherent light source apparatus.

An exemplary embodiment of the present invention will be explained below referring to FIGS. 3, 4, and 5, which are conceptual diagrams schematically showing part of a coherent light source apparatus. FIG. 3 shows a situation where a first light emission region (Gs) is made up of a plurality of distributed radiant points (Ks, Ks', --).

When the radiant point (Ks) is observed, as shown by outermost circumferential marginal rays (Lms1, Lms2), light flux which forms the radiant points (Ks) in a cone angle region defined by a bottom face (Ci) is distributed, and the principal ray (Lps) of the light flux from this radiant point is defined as a central ray of this light flux distribution. As a generality, the principal rays (Lps, Lps', --) have an angle with respect to the z axis which is an optical axis of an optical system, so that it is considered that a pupil exists in a point (Qs) where they intersect with the optical axis. In addition, when the principal rays (Lps, Lps', --) as shown in FIG. 4 are parallel to the optical axis of the optical system, it is considered that a pupil lies at infinity. FIG. 5 shows a situation where when the light flux which forms the radiant points (Ks, Ks', --) of the first light emission region (Gs) enters the optical system, and passes through the second optical system (Ef) through the first optical system (Eu) and the light deflection unit (Md), in the space of the first light emission region (Gs), for example, the principal rays (Lps, Lps', --) shown in FIG. 3 turn into the principal rays (Lpf, Lpf') which are approximately parallel to one another after they pass through the second optical system (Ef). Although the optical axis of the optical system is a z axis, the principal rays (Lpf, Lpf') are not parallel to at the z axis, rather parallel to the zf axis. The z axis of the optical system, which is located downstream of the light deflection unit (Md), is given an inclination by the light deflection unit (Md), and is projected by the second optical system (Ef), thereby forming the zf axis.

The optical system, in which the principal rays (Lpf, Lpf') are approximately parallel to each other, can be realized by designing so that the input side focal point of the second optical system (Ef) and the entrance pupil of the second optical system (Ef) may be in agreement with each other. For that purpose, that when an image of the pupil in the space of the first light emission region (Gs) is projected by the first optical system (Eu) as an exit pupil, as described above, it may be designed in agreement with the input side focal point of the second optical system (Ef). In addition, it may be designed based on the case where a deflection angle of the light deflection unit (Md) is zero. As explained above in relation to FIG. 1, the second optical system (Ef) forms a third light emission region (Gf) near an incident end (Pmi) of a light mixing unit (Fm) as an image, which is conjugate to the second light emission region (Gu) projected based on the first light emission region (Gs) by the first optical system (Eu). Although in general, the third light emission region (Gf) is not necessarily conjugate to the first light emission region (Gs), FIG. 5 shows that the third light emission region (Gf) is conjugate to the first light emission region (Gs). Therefore, the radiant points (Kf, Kf', --) which form the third light emission region (Gf) are conjugate to the radiant points (Ks, Ks', --). In addition, in order to realize it, the first optical system (Eu) may form the second light emission region (Gu) as an image, which is conjugate to the first light emission region (Gs).

In this way, it is preferable to make the principal rays (Lpf, Lpf') approximately parallel to one another after passing through the second optical system (Ef), especially in case where an optical guide is used as the light mixing unit (Fm). The reason is set forth below.

Since light inputted into the incident end (PmiA) of the light mixing unit (Fm) propagates inside the light mixing unit (FmA) while repeating full reflection on a side face of the light mixing unit (FmA) according to the same principle as an optical fiber, there is a limit of an angle formed by the incident rays and the central axis of the light mixing unit (Fm) in case where the incident rays can propagate inside the light mixing unit (Fm) without a loss, so that even if the light is incident thereon at an angle exceeding it, no total reflection occurs, whereby part of the light will deviate from the optical guide every time it reflects. Furthermore, for example, in an optical device such as a projector, there are constrained conditions on an angle for effectively using light, in addition to the optical guide such as the two-dimensional light amplitude modulation element (DmjA), the projection lens (Ej2A), etc. Therefore, it turns out that if there are rays exceeding the constrained angle $\Delta\Theta$ specified by the optical guide and an optical system on a downstream side thereof, among all the rays, before light flux enters an optical guide, it is advantageous to change them so as not to exceed it as much as possible.

Figure 5:
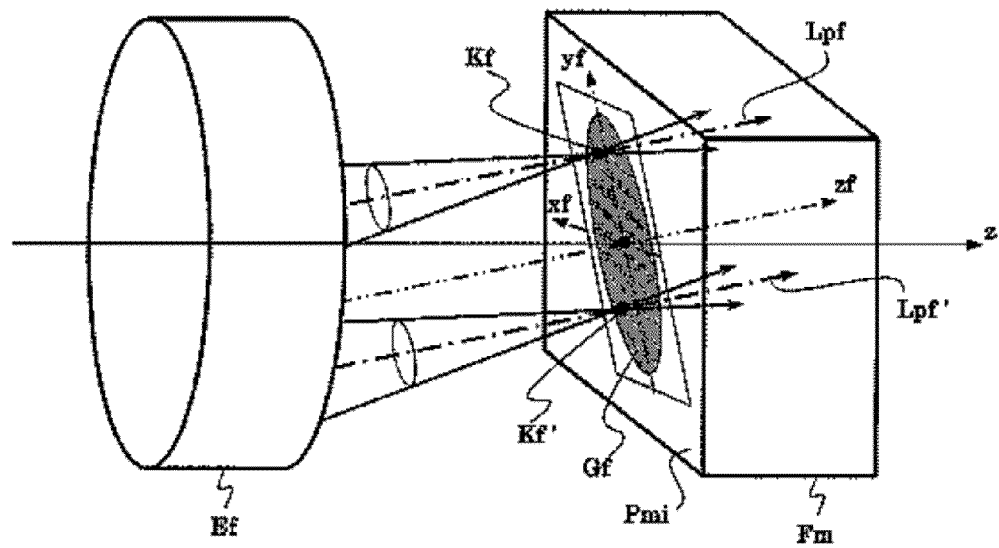
FIG. 5 is a conceptual diagram showing part of a coherent light source apparatus.

As can be understood from FIG. 5, light flux which forms each of the radiant points (Kf, Kf', --) of the third light emission region (Gf) is surrounded around by marginal rays with respect to the principal ray (Lpf, Lpf'). As a generality, when an apex angle of each cone angle region where such marginal rays exist and are dispersed, is represented as $\Delta\theta m$ in common to all the radiant points (Kf, Kf', --), and an apex angle of the cone angle region about the distribution as to the principal rays (Lpf, Lpf') of all the radiant points (Kf, Kf', --), which are included in the third light emission region (Gf), is represented as $\Delta\theta p$ (however, $\Delta\theta p=0$ in the optical system shown in FIG. 5), an apex angle of the cone angle region as the whole light flux which forms the third light emission region (Gf) is $\Delta\theta m+\Delta\theta p$. An angle margin $\Delta\Phi=\Delta\Theta-\Delta\theta m-\Delta\theta p$ with respect to the constrained angle $\Delta\Theta$ specified by the optical guide and the downstream optical system that this apex angle $\Delta\theta m+\Delta\theta p$ has, becomes a maximum value of a deflection angle at which the light deflection unit (Md) is allowed.

In order to avoid a problem of deterioration of the uniformity of the light projected by the speckle, which is solved by the present invention, it is clear that the larger a deflection angle that the light deflection unit (Md) has, the more advantageous it is. However, $\Delta\theta m$ is subject to given conditions $\Delta\Theta$, or constrained conditions resulting from the energy conservation theorem, that is, constrained conditions based on the theorem related to a Helmholtz-Lagrange invariant (which is also called a Huygens-Smith invariant, or a Smith-Helmholtz invariant), and the $\Delta\theta m$ cannot be arbitrarily set up. Therefore, the apex angle $\Delta\theta p$ of the cone angle region about the distribution as to the principal rays (Lpf, Lpf') is the only parameter which can be set freely by design. Here, since the $\Delta\theta p$ is set to 0 ($\Delta\theta p=0$), the maximum value of the deflection angle which can be given to the light deflection unit (Md) can be maximized. However, when the above-described angle margin $\Delta\Phi$ is a negative value even in the case of $\Delta\theta p=0$, although the light use efficiency decreases with introduction of the deflection, it remains the best to set it as $\Delta\theta p=0$. Therefore, in order to avoid the problem that the uniformity of the light projected by the speckle deteriorates, it turns out that it is advantageous to make the principal rays approximately parallel to one another after passing through the second optical system (Ef).

Figure 6:
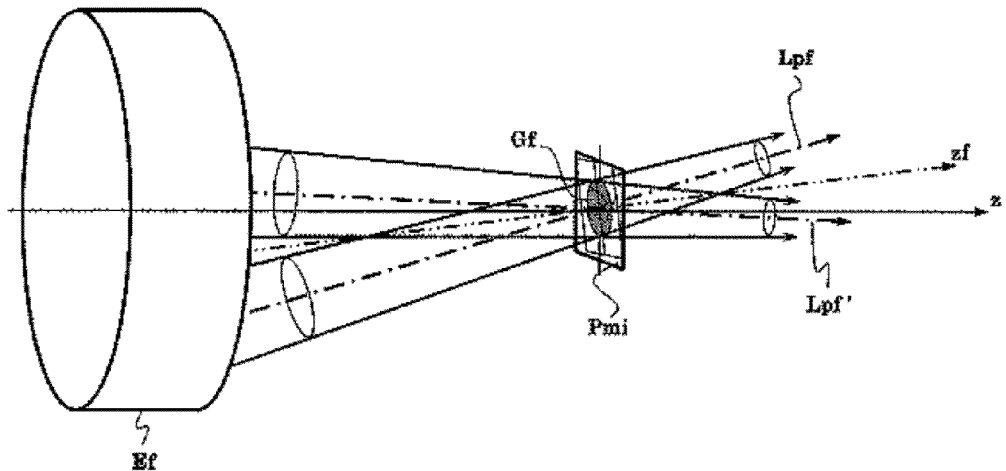
FIG. 6 is a conceptual diagram showing part of a coherent light source apparatus.

Description of an exemplary embodiment will be given below referring to FIG. 6. FIG. 6 is a conceptual diagram, which schematically shows part of a coherent light source apparatus. FIG. 6 shows a situation where when light flux which forms the radiant points (Ks, Ks', --) of the first light emission region (Gs) enters an optical system, and passes through a second optical system (Ef) through the first optical system (Eu) and the light deflection unit (Md), in the space of the first light emission region (Gs), for example, the principal rays (Lps, Lps', --) shown in FIG. 3 turn into the principal rays (Lpf, Lpf') which passes near the center of the third light emission region (Gs).

Although the optical axis of the optical system is a z axis, as to a zf axis, an inclination is given to the z axis of the optical system, which is located upstream of the light deflection unit (Md), by the optical deflection medium (Md), and it is projected by the second optical system (Ef), so that a zf axis may be formed. In addition, in order to avoid complexity of the figure, a light mixing unit (Fm) is omitted therefrom and only the incident end (Pmi) is shown in the figure. Moreover, the third light emission region (Gf) is configured as large in size as possible, as long as it does not go out of the incident end (Pmi).

The optical system, in which the principal rays (Lpf, Lpf') pass through the vicinity of the center of the third light emission region (Gf), can be realized by designing so that the exit pupil of the second optical system (Ef) may be formed on the third light emission region (Gf). For that purpose, when an image of the pupil in the space of the first light emission region (Gs) is projected by the first optical system (Eu) as an exit pupil, it may be designed so that the third light emission region (Gf) may be conjugate to the second light emission region (Gu). In addition, what is necessary is to just design it based on the case where the deflection angle of the light deflection unit (Md) is zero.

FIG. 6 shows, as an example, that an output image, which the second optical system (Ef) forms, may lie at positive infinity or at a positive distant place similar thereto, so as to correspond to the radiant points (Ks, Ks', --) of the first light emission region (Gs). In FIG. 6, the output image is depicted as an image at a positive distant place. However, the output image can be an image at a negative distance place, namely, at a focal plane on the input side of the second optical system (Ef). In order to realize the optical system whose output image point is located at such positive or negative distant place, what is necessary is just to design so that the image of the first light emission region (Gs) may be formed near the input side focal plane of the second optical system (Ef), and this design thereof may coexist with the design in which the exit pupil of the second optical system (Ef) may be formed on the third light emission region (Gf).

It is especially suitable to make the configuration such that the principal rays (Lpf, Lpf') may pass near the center of the third light emission region (Gf) after passing through the second optical system (Ef), when a fly eye integrator is used as the light mixing unit (Fm), even though an optical guide may also be used as the light mixing unit (Fm) alternatively. The reason therefor will be given below.

As described above, when such a fly eye integrator is used as the light mixing unit (Fm), although it is desirable to form the third light emission region (Gf), which is formed near the incident end (Pmi), as an illumination region which spreads over the entire region of the incident end (Pmi), an important point is that there is the constrained angle, in which there is an upper limitation with respect to a distribution range of angle of the rays contained in light flux. The situation where there is the constrained angle, is similar to the situation in an optical device such as a projector including an optical guide where there is the constrained angle $\Delta\Theta$. To come right to the point, in short, if there are rays exceeding the constrained angle specified by the optical system, it is advantageous to make a change so as not to exceed it as much as possible.

Since as to the exit pupil, principal rays collect at the center of the third light emission region (Gf), it may be said that it is the most compact position on an optical axis in order that light flux may enter the incident end (Pmi) efficiently. If, in the space where light flux exists, a screen is set at right angle with respect to an optical axis and the screen is moved along the optical axis, the size of a region where light is illuminated, changes. However, because the angle distribution of the rays contained in the light flux does not change, it may be necessary to select the position thereof, at which the size of the region where light is illuminated becomes the most compact, and an exit pupil is selected as the strongest candidate. In addition, although there may be a more compact position near a portion which is conjugate to the first light emission region (Gs), because of the above-mentioned reason, this position is inappropriate when a fly eye integrator is used as a light mixing unit (Fm).

When the size of an exit pupil, i.e., the third light emission region (Gf), is too small as compared with the size of the incident end (Pmi), because it is compact, if the magnification of the image formation to the third light emission region (Gf) from the second light emission region (Gu) which has a conjugate relation therewith is increased so as to be fit in the size of the incident end (Pmi), since a distribution range $\Delta\theta$ of the angles of the rays contained in light flux becomes small according to the theorem about the Helmholtz-Lagrange invariant, part obtained by deducting this distribution range from the constrained angle, i.e., angle margin $\Delta\Phi$, increases, so that it becomes possible to assign this increased margin angle for an increase in the maximum value of deflection angle, which can be given to the light deflection unit (Md).

However, even if the angle range $\Delta\theta$ is set to the minimum, when the angle margin $\Delta\Phi$ is a negative value, although there is a decline in light use efficiency with introduction of a deflection, the minimization of $\Delta\phi$ remains the best way. Therefore, it turns out that it is advantageous in avoiding the problem that the uniformity of the light projected by the speckle deteriorates, to make a configuration so that the principal rays pass near the center of the third light emission region (Gf) after passing through the second optical system (Ef).

Figure 7:
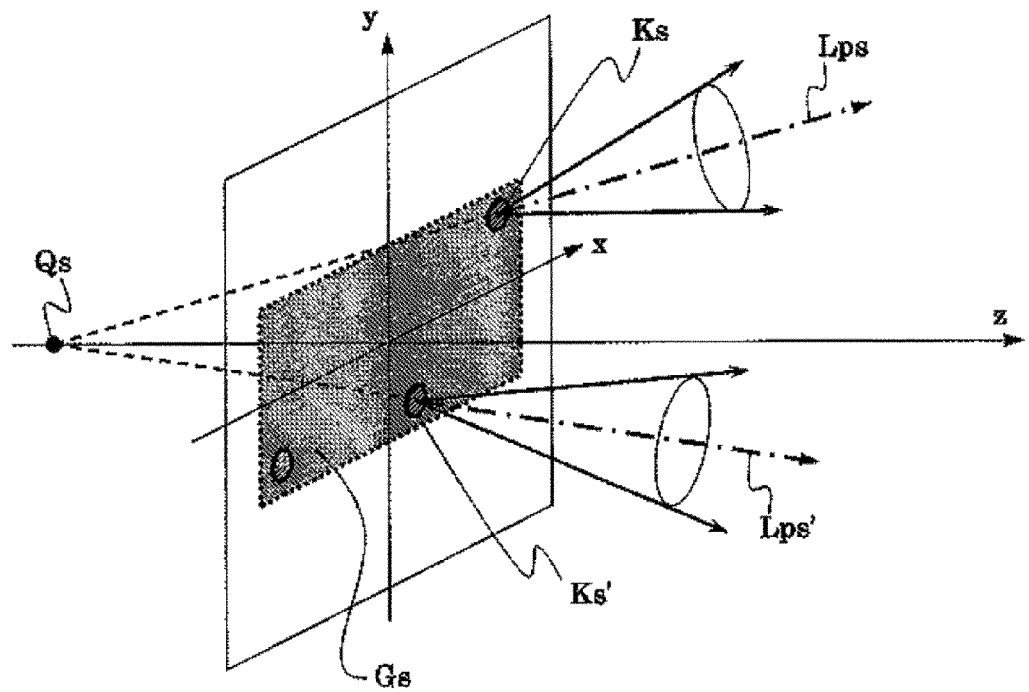
FIG. 7 is a conceptual diagram showing part of a coherent light source apparatus.

Description of an exemplary embodiment will be given below referring to FIG. 7. FIG. 7 is a conceptual diagram showing part of a coherent light source apparatus. As described in conjunction with FIG. 5, after the light flux passes through a second optical system (Ef), it turns into the principal rays (Lps, Lps', --), which are approximately parallel to one another, that is, the angle margin $\Delta\Phi$ is increased by setting $\Delta\theta$ to zero ($\Delta\theta p=0$), whereby the deflection angle, which is permitted in the light deflection unit (Md) can be made large. Since it is deemed that $\Delta\theta m$ which is an apex angle of the cone angle region where marginal rays distribute and exist at this time, cannot be arbitrarily set up so that it has been left untouched. However, it is also advantageous for further improvement to make it small.

Although the third light emission region (Gf) and the first light emission region (Gs) should not necessarily be conjugate to each other, since the principal rays (Lpf, Lpf') are approximately parallel to one another in the space of the third light emission region (Gf), when the position in the optical axis direction of the third light emission region (Gf), is selected so that the third light emission region (Gf) and the first light emission region (Gs) are conjugate to each other or have a condition similar thereto, whereby the size of the third light emission region (Gf) can be made small. If the size of the third light emission region (Gf) is small more than necessary, compared with the size of the incident end (Pmi), Δθm can be made small by greatly correcting the magnification from the first light emission region (Gs) to the third light emission region (Gf), according to the theorem of the Helmholtz-Lagrange invariant.

And, the conditions under which this magnification can be most increased, are that the shape of the third light emission region (Gf), which the second optical system (Ef) forms, matches the shape of the incident end (Pmi) of the light mixing unit (Fm), and the incident end (Pmi) and the third light emission region (Gf) have approximately similarity shapes where minimum margin is kept. Therefore, it turns out that what is necessary is just to arrange or distribute the radiant points (Ks, Ks', --) in the first light emission region (Gs) so that such a third light emission region (Gf) can be realized.

If the shape of, for example, the incident end (Pmi) is a landscape-oriented quadrangle, as in FIG. 7, it is advantageous to arrange the radiant points (Ks, Ks', --) so as to form the first light emission region (Gs) having an approximate similarity shape.

Figure 8:
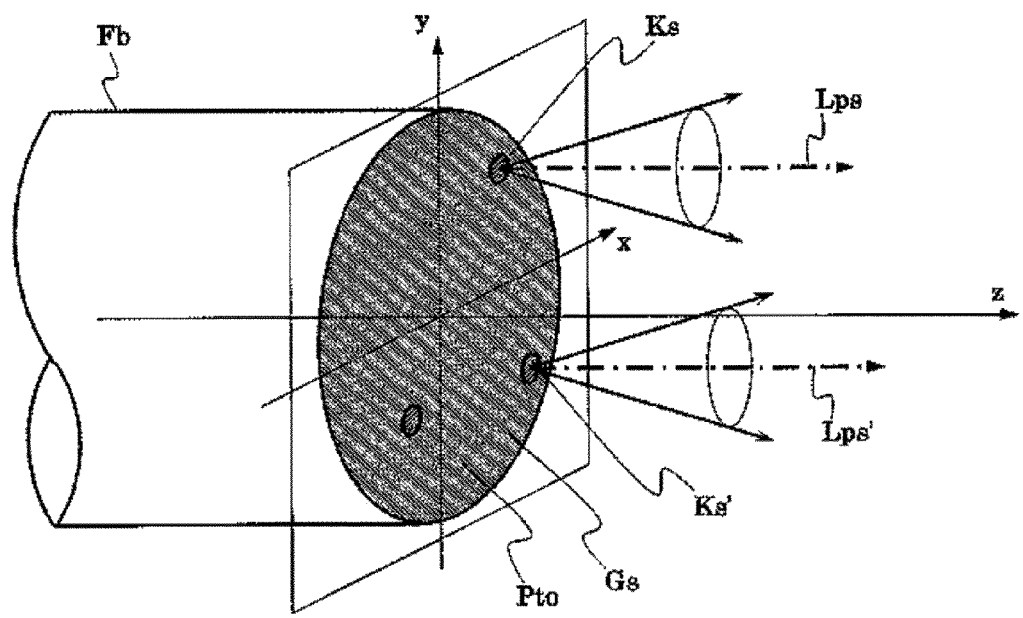
FIG. 8 is a conceptual diagram showing part of a coherent light source apparatus.
Figure 9:
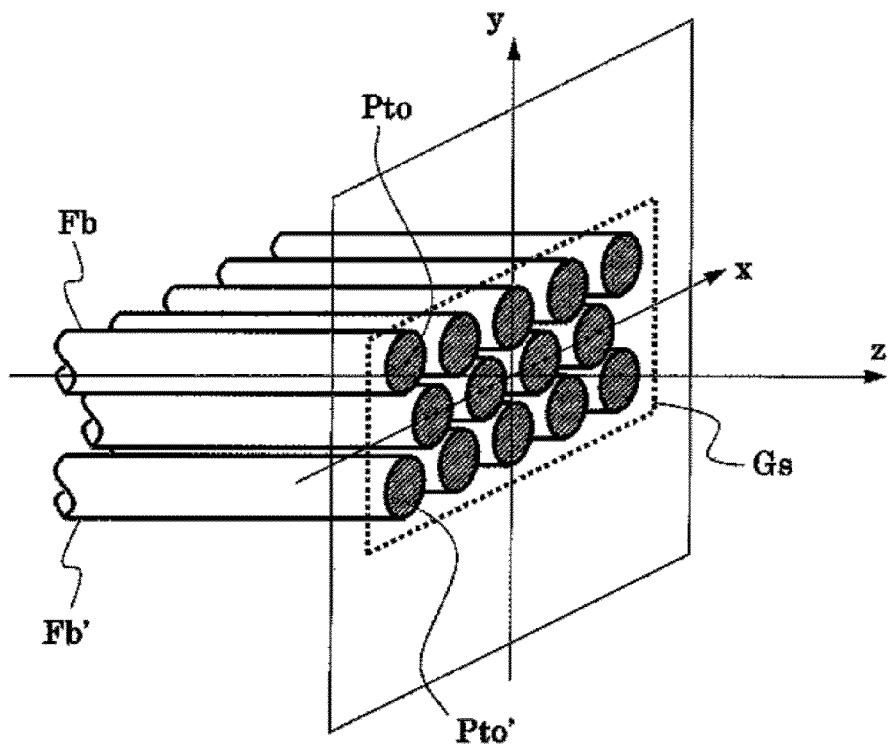
FIG. 9 is a conceptual diagram showing part of a coherent light source apparatus.

An exemplary embodiment will be described below referring to FIGS. 8 and 9. FIGS. 8 and 9 are conceptual diagrams showing part of a coherent light source apparatus. As described above, a radiant section of diffusing light which exists on a surface of a semiconductor chip serves as a first light emission region (Gs) when a coherent light source (Sc) is a semiconductor laser, and furthermore the present exemplary embodiment, which is suitable when two or more semiconductor lasers are used, is described. Not only a primary light source that actually generates light, but also a secondary light source, from which light is emitted by transmitting or projecting light from the primary light source, may be configured so as to serve as the first light emission region (Gs).

As an example thereof, the first light emission region (Gs) can be formed by an emission end (Pto) of the optical fiber (Fb) to which light of a coherent light source (Sc) is inputted from the incident end, so that as shown in FIG. 8, the whole core on a side of the emission end of the optical fiber may serve as the first light emission region (Gs). Even if the number of optical fibers is one at this time, it cannot usually be treated as a point light source, so that the first light emission region (Gs) must be considered as a light emission region on which radiant points are continuously distributed in a limited area. Namely, the radiant points (Ks, Ks', --), which are formed approximately uniformly, are continuously distributed on the emission end (Pto) which is a core of the optical fiber, and light is emitted from each of the radiant points (Ks, Ks', --) according to the apex angle of the cone angle region where marginal rays defined by the structure of the optical fiber are distributed and exist. Since the principal rays (Lps, Lps', --) become parallel to the axis of the optical fiber in that case, what is necessary is just to coincide this axis with the z axis which is an optical axis of the optical system. In such case, it becomes the same situation as that in the case which is described referring to FIG. 4.

As shown in FIG. 9, when two or more optical fibers (Fb, Fb', --) are used, they are arranged so that the axes of all the optical fibers may be parallel to the z axis, which is an optical axis of the optical system, and so that the emission ends (Pto, Pto', --) of all the optical fibers (Fb, Fb', --) may be located on one plane. In this case, a region, which the emission ends (Pto, Pto', --) form as a whole, will function as the first emission region (Gs). At that time, as described referring to FIG. 7, it is advantageous to arrange the emission ends (Pto, Pto', --), which are distribution of the radiant points (Ks, Ks', --) in the first light emission region (Gs) so that the shape of the third light emission region (Gf) which the second optical system (Ef) forms may matches the shape of the incident end (Pmi) of the light mixing unit (Fm). For example, what is necessary is just to arrange the emission end (Pto, Pto', --) so that the first light emission region (Gs) may have a shape approximately similar to the shape of the incident end (Pmi), may be formed.

In addition, FIGS. 8 and 9 show only the core of an optical fiber, wherein the structure for holding a clad, (especially in the case of two or more optical fibers) or emission ends (Pto, Pto', --) in a predetermined position, and cable covering, etc., are omitted.

As an advantage of using optical fibers for the coherent light source apparatus according to the present invention, a degree of freedom increases in arrangement of an application apparatus, and repair and component replacement at time of failure become easy, by separating a light generating part and a part to be used from each other and connecting them with a flexible cable, and in addition, the optical fiber itself has a function as a light mixing unit. That is, when light of a primary light source such as a semiconductor laser, which does not contain a speckle from the beginning, is passed through an optical fiber so as to change it into a secondary light source which has a fine speckle and then further it is passed through the light mixing unit (Fm), a spotty or patchy pattern of the speckle becomes fine, so that the speckle becomes invisible, and it is possible to enhance the effect that it becomes difficult to be viewed.

As described above, in a projector, which projects and displays an image by using some sort of light source such as a high intensity discharge lamp of related art, although a light homogenizing unit such as an optical guide and a fly eye integrator is indispensable components, the light homogenizing unit can be also made to function as the light mixing unit (Fm), which is a component of the present invention, in order to avoid the problem that the uniformity of the light projected by the speckle deteriorates. Therefore, when the projector which projects and displays the image using the coherent light source apparatus according to the present invention is realized as a light source, it is possible to lower the cost by configuring so that the light homogenizing unit may serve as the light mixing unit (Fm).

As described above, in order to display a color image in a projector of related art, for example, a dynamic color filter such as a color wheel is arranged downstream of the light homogenizing unit, so that two-dimensional light amplitude modulation element is illuminated with color sequential light flux of R-G-B (red and green, blue), whereby color display is realized by time division, or a dichroic mirror or a dichroic prism is arranged downstream of the light homogenizing unit, so that the two-dimensional light amplitude modulation element independently provided for each color is illuminated with light which is separated into the three primary colors of R-G-B, and further a dichroic mirror and a dichroic prism for performing color synthesis of the three primary color modulation light flux of R-G-B are arranged.

Also in the projector according to the present invention, although the light source having required kinds of color phases is needed, a white first light emission region (Gs) is formed by color synthesis of them, for example, using the R-G-B three primary color coherent light source, and as described above, the white light passes through a first optical system (Eu), a light deflection unit (Md), and a second optical system (Ef), and enters the light mixing unit (Fm), which serves as a light homogenizing unit, whereby as in the case of the projector of related art, it is possible to carry out time division processing or color separation and color synthesis by a dynamic color filter, in the downstream of the light mixing unit.

In addition, in the case where the optical fiber shown in FIG. 9, when the color synthesized first light emission region (Gs) is formed, it is possible to form the first light emission region (Gs) which is made up of two or more color parts, by bundling the emission ends (Pto, Pto', --) of the optical fiber where lights of different colors enter the incident ends. Or a first light emission region (Gs) of a single color is formed for every color, and they are overlaid by using a color-synthesis unit such as a dichroic mirror and the light is sent to the first optical system (Eu), so that the first light emission region (Gs), where the color synthesis is carried out, can also be formed. In addition, if a side of the color-synthesis unit is viewed from a side of the first optical system (Eu), one first light emission region (Gs), which has two or more colors, can be seen, and in the optical field, this state is regarded as the color synthesized first light emission region (Gs) being formed.

Or a first light emission region (Gs) may be formed independently for every color, and it passes through a first optical system (Eu), a light deflection unit (Md), a second optical system (Ef), and the light mixing unit (Fm) which serves as a light homogenizing unit, thereby illuminating the two-dimensional light amplitude modulation element and forming a single color image, so that color synthesis is carried out.

Or a color sequential first light emission region (Gs) may be formed by driving a coherent light source in a time dividing manner, for example, in an order of R-G-B, it passes through a first optical system (Eu), a light deflection unit (Md), a second optical system (Ef), and a light mixing unit (Fm) which serves as a light homogenizing unit, thereby illuminating the two-dimensional light amplitude modulation element and forming a color sequential color image.

An exemplary embodiment will be explained below, referring to drawings which show a concrete structure. First, description of a coherent light source apparatus will be given below referring to FIG. 10. A first light emission region (Gs) is formed by a radiant section of the diffusing light which exists on a surface of a semiconductor chip in a semiconductor laser light source unit (Ls) whose light source is made up of one or two or more semiconductor lasers. In the first optical system (Eu) which is made up of a collimating lens (Es) for changing it into an image at infinity, and an imaging lens (Eu1), an image of a second light emission region (Gu) is formed on a deflection mirror (Mdm), as an image conjugate to the first light emission region (Gs).

Although the case of the semiconductor laser light source unit (Ls), whose light source is made up of two or more semiconductor lasers, configured is based on the case where all the principal rays from the first light emission region (Gs) are parallel to an optical axis, even if they are not parallel, the optical system having the same functions can be realized by controlling and designing the position of the image plane and a pupil position on an optical axis.

Although the deflection mirror (Mdm) is, for example, circular, and is attached to the rotational axis of a mirror rotation motor (Mdd) so as to be rotated, it is attached so that the normal vector of a reflective face of the deflection mirror (Mdm) may incline by only a predetermined angle with respect to a rotational axis. By such a configuration, since a trajectory of the normal vector is rocked so as to draw a circular conical face, with rotation of the mirror rotation motor (Mdd), the deflection mirror (Mdm) turns into a rotation rocking mirror, and functions as a light deflection unit (Md). In addition, what is necessary is just to decide the above-mentioned angle formed by the normal vector of the reflective face and the rotational axis according to an angle margin ΔΦ.

Light flux (Bd) deflected by the light deflection unit (Md) enters the second optical system (Ef) which is made up of lenses (Ef11, Ef12) and a last lens (Ef13), and in this second optical system (Ef), an image of a third light emission region (Gf) is formed on the incident end (Pmi) of the light mixing unit (Fm) which is made up of the optical guide, as an image conjugate to the second light emission region (Gu) on the deflection mirror (Mdm). At this time, as explained above with respect to FIG. 5, what is necessary is just to make the principal rays approximately parallel to one another after passing through the second optical system (Ef).

As described above, the optical system, in which the principal rays of output light flux become approximately parallel to one another, can be realized by designing so that the input side focal point of the second optical system (Ef) and the entrance pupil of the second optical system (Ef) may be in agreement with each other. However, simply put, referring to FIG. 10, what is needed is just to make the input side focal point and the entrance pupil (Qf3) in agreement with each other, by paying attention to the last lens (Ef13). And this entrance pupil (Qf3) is a conjugate image of the exit pupil (Qu) of the collimating lens (Es), according to the case where the deflection angle of the deflection mirror (Mdm) is zero, and considering that all the principal rays from the first light emission region (Gs) are parallel to the optical axis, the exit pupil (Qu) is in agreement with the output side focal point of the collimating lens (Es).

Figure 10:
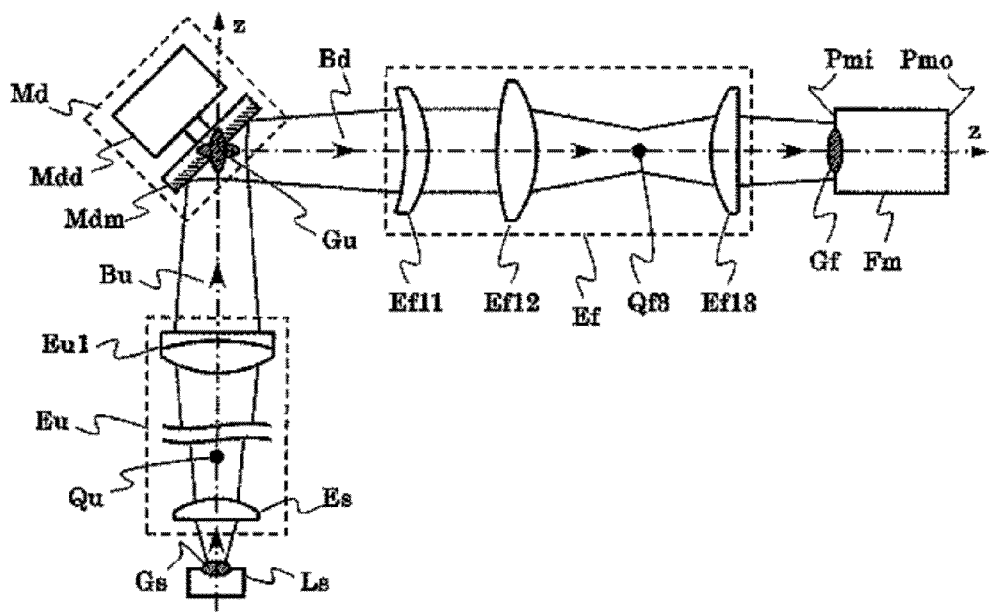
FIG. 10 is a schematic diagram showing one form of an embodiment of a coherent light source apparatus.

By the above-mentioned configuration, the coherent light source apparatus shown in FIG. 10 can maximize the maximum value of the deflection angle which can be given to the light deflection unit (Md). However, when the above-described angle margin ΔΦ is a negative value, even in the case of Δθp=0, although the light use efficiency decreases with introduction of the deflection, it remains the best to set it as Δθp=0. Therefore, it is advantageous in avoiding the problem that the uniformity of the light projected by the speckle deteriorates.

Next, description of a coherent light source apparatus shown in FIG. 11 will be given below. Similarly to that described above with respect to FIG. 10, a first light emission region (Gs) is formed by a radiant section of the diffusing light which exists on a surface of a semiconductor chip in a semiconductor laser light source unit (Ls) whose light source is made up of one or two or more semiconductor lasers. In addition, where the light source of the semiconductor laser light source unit (Ls) is made up of two or more semiconductor lasers, although it is configured based on the case where all the principal rays from the first light emission region (Gs) are parallel to an optical axis, even if they are not parallel, the optical system having the same functions can be realized by controlling and designing the position of the image plane and a pupil position on an optical axis.

In the first optical system (Eu) which is made up of a collimating lens (Es) for changing the first light emission region (Gs) into an image at infinity, and a lens (Eu21, Eu22), an image of a second light emission region (Gu) is formed on the deflection mirror (Mdm) as an image conjugate to the exit pupil (Qu) of the collimating lens (Es) (which is in agreement with the output side focal point of the collimating lens (Es) when all the principal rays from the first light emission region (Gs) are parallel to an optical axis).

Figure 11:
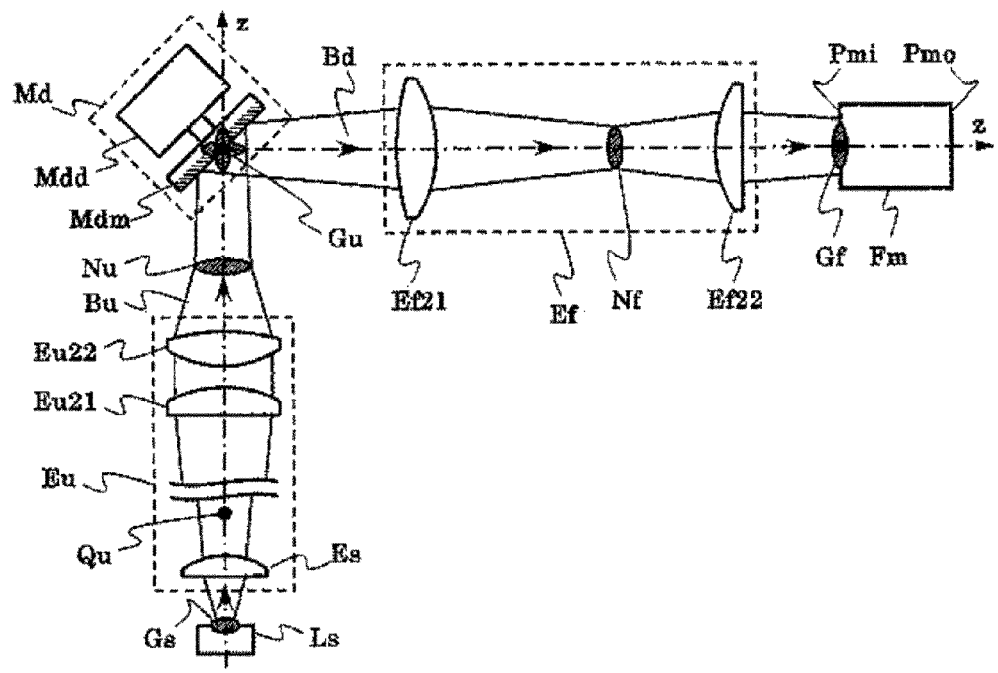
FIG. 11 is a schematic diagram showing one form of an embodiment of a coherent light source apparatus.

In addition, at this time, although in FIG. 11, an image conjugates to the first light emission region (Gs) is shown as a conjugate image (Nu) which exists between the first optical system (Eu) and the deflection mirrors (Mdm), this may be located between the lenses (Eu21, Eu22). Moreover, similarly to that described above with respect to FIG. 10, the deflection mirror (Mdm) functions as a light deflection unit (Md), and for example, the rotation rocking mirror etc. are suitable therefor.

The light flux (Bd) deflected by the light deflection unit (Md) enters the second optical system (Ef) which is made up of a lens (Ef21) and a last lens (Ef22). In this second optical system (Ef), an image of a third light emission region (Gf) is formed on the incident end (Pmi) of the light mixing unit (Fm) which is made up of a fly eye integrator as a conjugate image to the second light emission region (Gu) on the deflection mirror (Mdm). At this time, as described above with respect to FIG. 6, an output image that the second optical system (Ef) forms, may suitably lie at infinity or at a distant place similar thereto.

As described above, in order to realize the optical system whose output image point is located at such distant place, what is needed is just to design so that the image of the first light emission region (Gs) may be formed near the input side focal plane of the second optical system (Ef). However, simply put, referring to FIG. 11, it is necessary to configure so that the conjugate image (Nf) of the conjugate image (Nu) of the first light emission region (Gs) is formed on the input side focal plane, by paying attention to the last lens (Ef22).

Moreover, since the third light emission region (Gf) is conjugate to the second light emission region (Gu), which is conjugate to the exit pupil (Qu) of the collimating lens (Es), so that it is only necessary for the third light emission region (Gf) to serve as an exit pupil of the last lens (Ef13), what is needed is just to form this on the output side focal plane of the last lens (Ef13).

Therefore, since what is needed is to make all the principal rays of the conjugate image (Nf) parallel to the z axis which is an optical axis, on the basis of the case where the deflection angle of the deflection mirror (Mdm) is zero, the third light emission region (Gf), which is conjugate to the second light emission region (Gu), which is conjugate to the exit pupil (Qu) of the collimating lens (Es), may be located on an input side focal plane of the lens (Ef21).

As mentioned above, in the coherent light source apparatus shown in FIG. 11, since the third light emission region (Gf) is formed as an exit pupil in the incident end (Pmi) of the light mixing unit (Fm), the third light emission region (Gf) becomes compact. Moreover, if the magnification of the image formation to the third light emission region (Gf) is adjusted and the size of the incident end (Pmi) is matched therewith, since the distribution range of the angle of the rays contained in light flux is made small, it is advantageous in avoiding the problem that the uniformity of the light projected by the speckle deteriorates.

Although a configuration method of the optical system shown in FIG. 11 is a little complicated in this way, examples, which can be easily and intuitively understood are as follows: the lenses (Eu21, Eu22) form a confocal point system, wherein the conjugate image (Nu) is formed on a common focal plane between the lenses (Eu21, Eu22), so that the conjugate image of the conjugate image (Nu) is located at infinity after passing through the first optical system (Eu); the lens (Eu22) and the lens (Ef21) form a confocal point system, and the deflection mirror (Mdm) is located on a common focal plane between the lens (Eu22) and the lens (Ef21); and the lens (Ef21) and the last lens (Ef22) form the confocal point system, and the conjugate image (Nf) is formed on the common focal plane between the lens (Ef21) and the last lens (Ef22). Of course this can be realized.

The semiconductor laser light source unit (Ls) including two or more semiconductor lasers is referred above. Description of realization thereof will be briefly given below.

Figure 4:
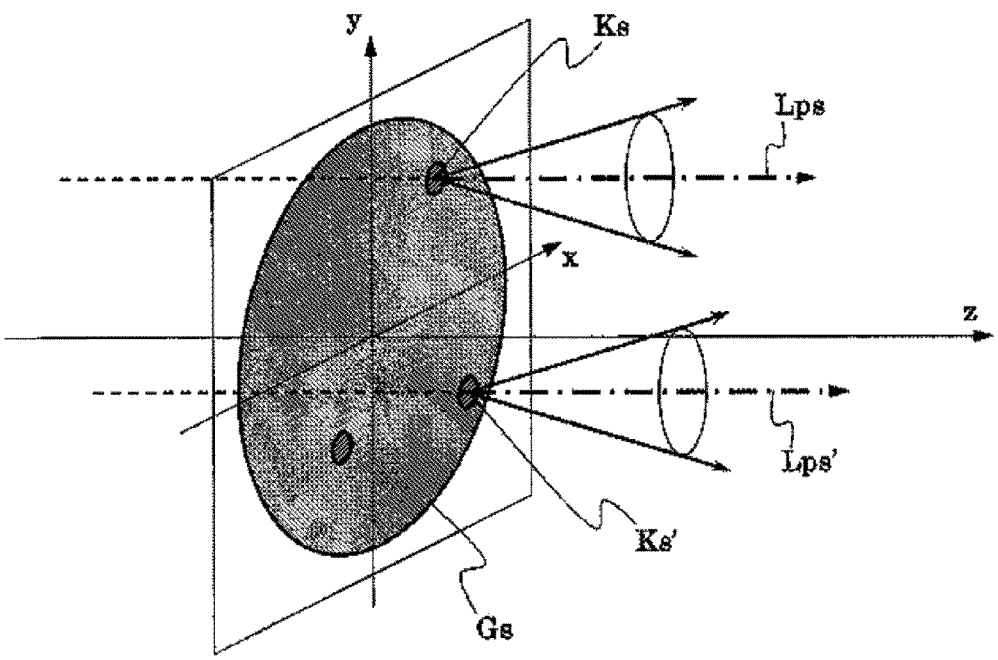
FIG. 4 is a conceptual diagram showing part of a coherent light source apparatus.
Figure 12:
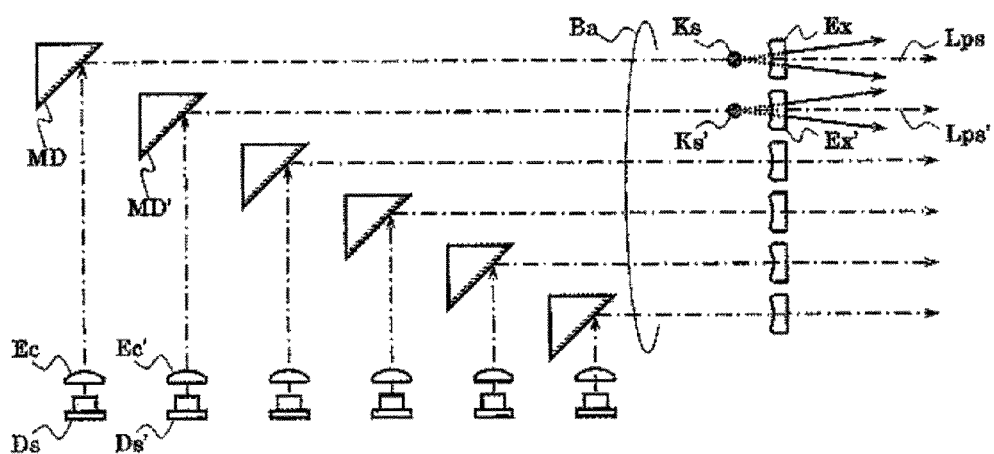
FIG. 12 is a schematic conceptual diagram showing one form of part of an embodiment of a coherent light source apparatus.

As shown in FIG. 12, the necessary number of discrete type semiconductor laser light sources (Ds, Ds', --), in each of which the semiconductor laser having one radiant point is accommodated, are aligned, and collimating lenses (Ec, Ec', --) are respectively attached and arranged to metal casing which has windows made of sapphire etc., whereby after diverging light from each semiconductor laser, i.e., an image point at infinity is changed into a collimated beam, and a beam sequence (Ba), which has desired beams and intervals, is formed using a beam synthesizing mirror (MD, MD', --), and then is changed into the radiant points (Ks, Ks', --) at a finite distance by divergent lenses (Ex, Ex', --), which are aligned and arranged corresponding to the number of beams, the principal rays (Lps, Lps', --) from the radiant points (Ks, Ks', --) becomes approximately parallel to one another, so that the situation shown in FIG. 4 and explained therewith can be realized. Therefore, the radiant points (Ks, Ks', --) shown in FIG. 12 are suitable for use in the semiconductor laser light source unit (Ls) shown in FIG. 10 or FIG. 11.

Figure 13A:
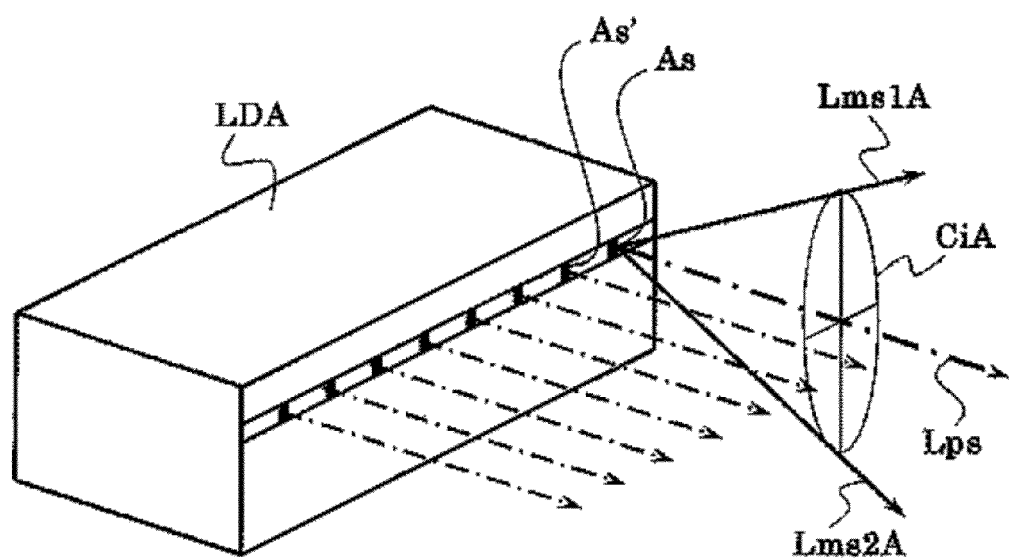
FIGS. 13A and 13B are schematic diagrams showing one form of an element, which relates to a coherent light source apparatus.

In the coherent light source apparatus according to the present invention, in addition to the above described discrete type semiconductor laser light source, a semiconductor laser array device (LDA) shown in a conceptual diagram of FIG. 13A may be also used. The semiconductor laser active regions (As, As', --) are laid out in a line on the end surface of this semiconductor laser array device (LDA), and diverging light is emitted from each semiconductor laser active region (As, As', --). Either in a discrete type or an array type, the divergence angle of the radiant beam of an end face emission type semiconductor laser becomes large under the influence of diffraction phenomena. The divergence angle in a direction perpendicular to a board surface (of a semiconductor chip of the semiconductor laser), is especially large as shown as marginal rays (Lms1A, Lms2A), that is, there is a characteristic that a bottom face (CiA) of a cone that represents a range of the emission angle, becomes a remarkable ellipse instead of a circle.

Although a collimating lens is used in order to change this radiant beam into a collimated beam, it is necessary to use that having a short focal distance according to a component in a direction perpendicular to the board surface where a divergence angle is large. Even if such a collimating lens is used, in the case of a discrete type semiconductor laser, although there is no big problem where it does not mater even if a beam becomes flat. In the case of an array type semiconductor laser, when all the radiant beams of the semiconductor laser active region (As, As', --) are changed into collimated beams by one collimating lens, since a focal distance is short, there is a problem that the principal rays of the semiconductor laser active regions (As, As', --) respectively have a large angle with respect to one another.

Figure 13B:
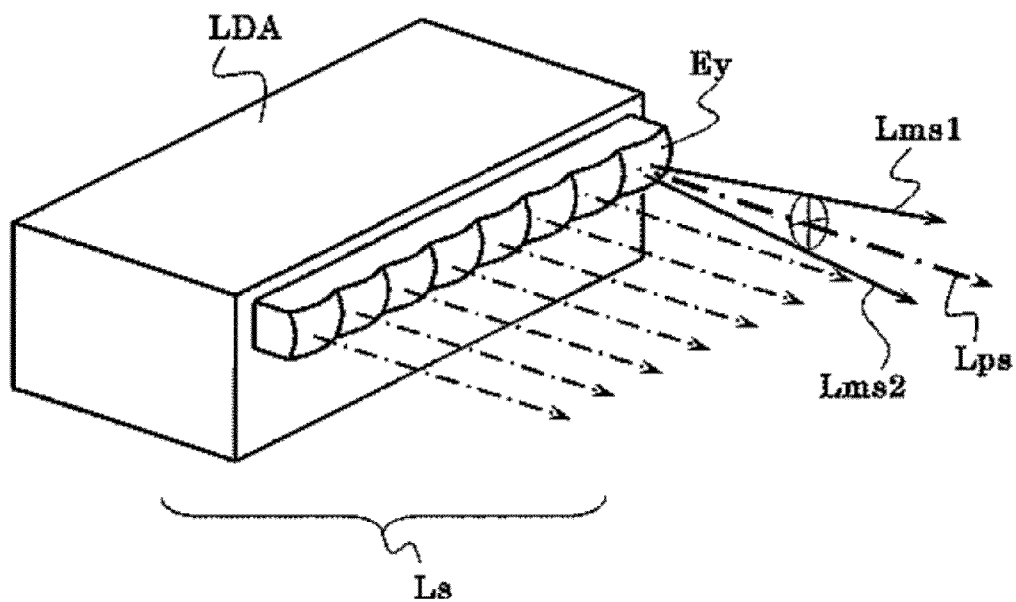

Therefore, an emission angle correction lens array (Ey) as shown in FIG. 13B can be used therefor. This emission angle correction lens array (Ey) individually performs collimation to each radiant beam from the semiconductor laser active region (As, As', --), and in order to solve the problem that the divergence angle in a direction perpendicular to the board surface is large, a toric surface is molded wherein a refractive surface of each emission angle correction lens array (Ey) is not a spherical surface, and a curvature radius thereof in a direction perpendicular to a board surface differs from that in a direction parallel thereto. While the divergence angle in a direction parallel to the board surface is reduced as in the marginal rays (Lms1, Lms2), the divergence angle in a direction perpendicular to the board surface decreases more than that, and ideally the divergence angle in a direction parallel to the board surface and that in perpendicular thereto are made approximately equal to each other.

Because the principal rays (Lps) from the semiconductor laser active region (As, As', --) are parallel to one another, the beam sequence is compact, and the semiconductor laser array device (LDA) with the emission angle correction lens array (Ey) shown in FIG. 13 can be suitably used as the semiconductor laser light source unit (Ls) shown in FIG. 10 or FIG. 11.

Instead of realizing such a toric surface, a cylindrical lens which has a curvature in a direction perpendicular to the board surface and which common to the semiconductor laser active region (As, As', --), and one next to each of the individual cylindrical lenses, which has a curvature in a direction parallel to the board surface semiconductor laser active region (As, As', --), are prepared, whereby it is possible to realize a similar function to the emission angle correction lens array (Ey) by the combination.

Figure 14A:
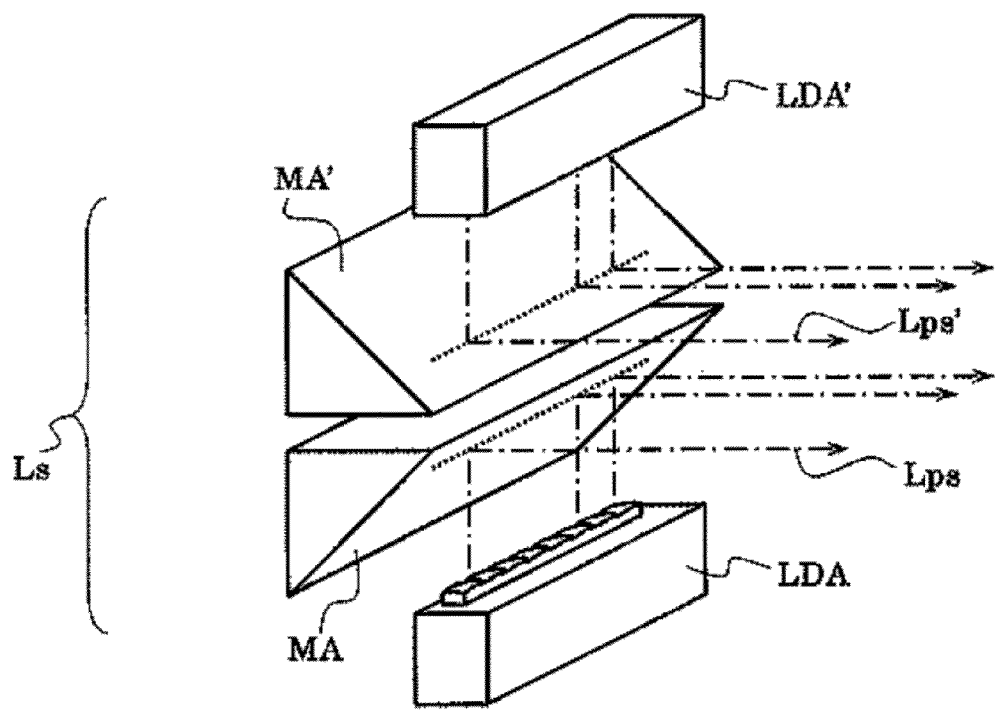
FIGS. 14A and 14B are schematic conceptual diagrams showing one form of part of an embodiment of a coherent light source apparatus.

Moreover, FIG. 14A shows a configuration example in which two semiconductor laser array devices (LDA) with an emission angle correction lens array (Ey) are used together. The beam sequences from the semiconductor laser array devices (LDA, LDA') are synthesized so as to form a batch of beams by using a beam synthesizing mirror (MA, MA'). In that case, it is preferable to arrange them so that all the principal rays (Lps, Lps', --) from each semiconductor laser array device (LDA) may be parallel to one another.

Figure 14B:
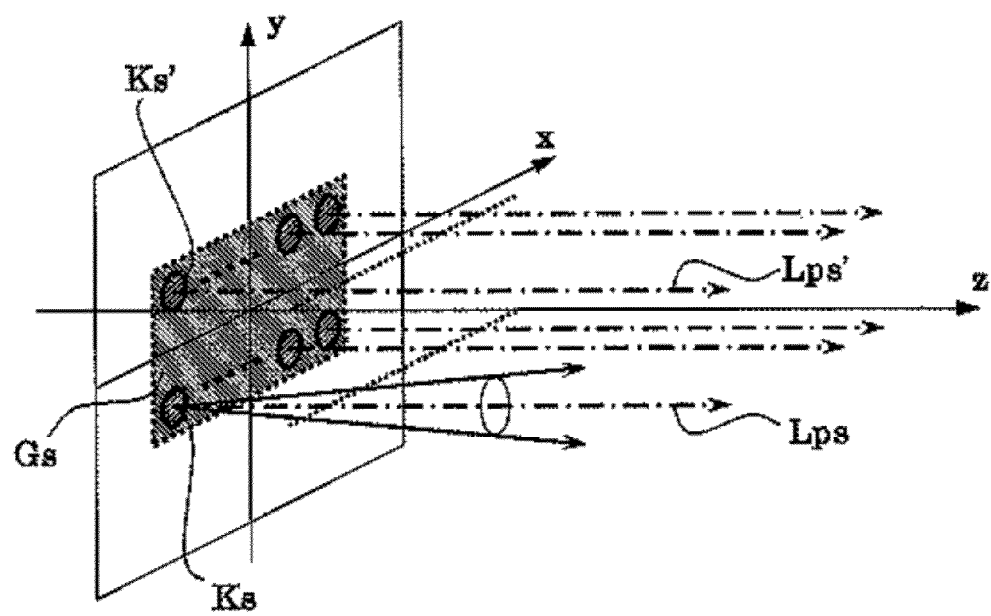

Although it is suitable to use the semiconductor laser array devices (LDA, LDA') shown in FIG. 10 or FIG. 11 as the above-described semiconductor laser light source unit (Ls), FIG. 14B shows a state of the first light emission region (Gs) formed thereby. Although a semiconductor laser active region of each of the semiconductor laser array devices (LDA, LDA') forms a radiant point (Ks, Ks', --), as to the shape of the first light emission region (Gs) that the radiant points (Ks, Ks', --) form, as described above with respect to FIG. 7, it is advantageous to arrange or distribute the radiant points (Ks, Ks', --) in the first light emission region (Gs) so that the shape of the third light emission region (Gf) which the second optical system (Ef) forms matches the shape of the incident end (Pmi) of the light mixing unit (Fm).

Figure 15A:
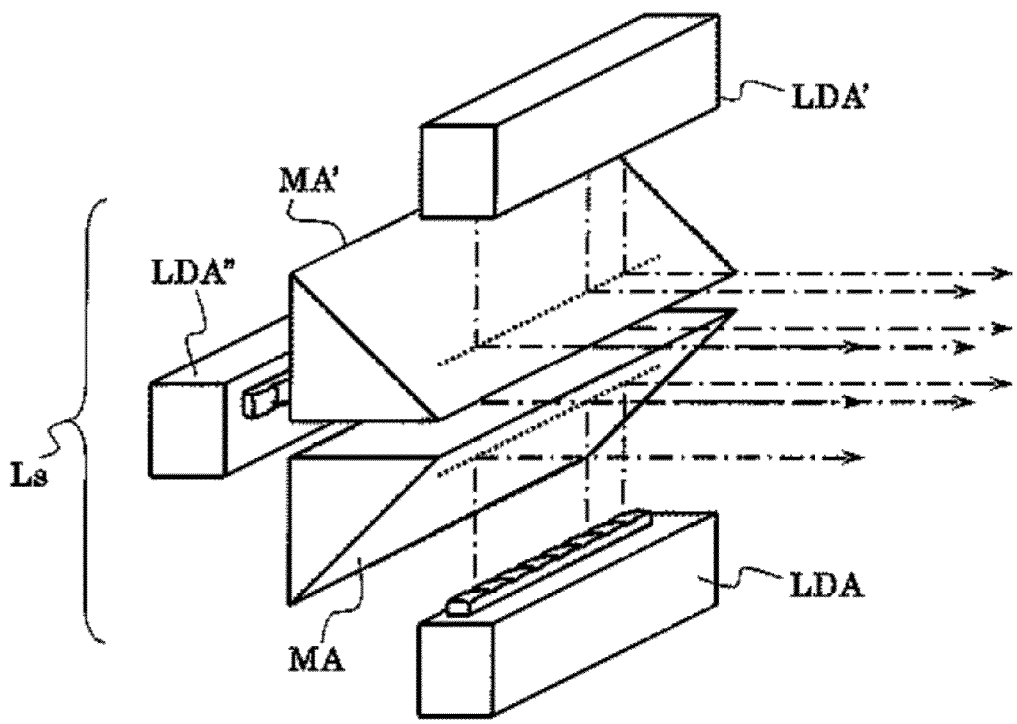
FIGS. 15A and 15B are schematic conceptual diagrams showing one form of part of an embodiment of a coherent light source apparatus.
Figure 15B:
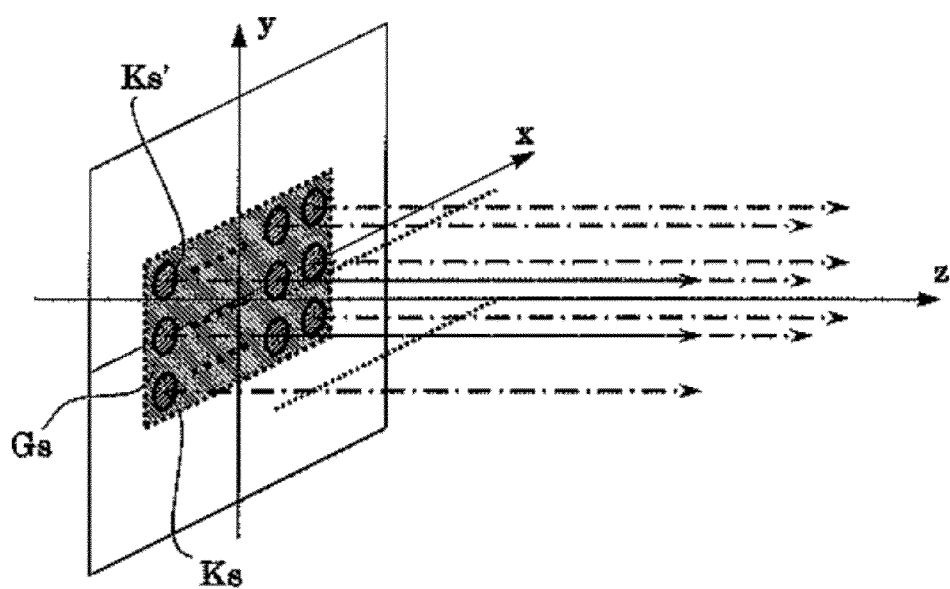

FIGS. 15A and 15 shows a configuration of an example in which a semiconductor laser light source unit (Ls) is formed by three semiconductor laser array devices (LDA, LDA', LDA"), wherein FIGS. 5A and 5B respectively corresponding to FIG. 14A and FIG. 14B. If beam synthesizing mirrors (MA, MA') are arranged so as to not partially block a beam, taking into consideration the thickness and the spread angle of beams from the semiconductor laser array devices (LDA, LDA', LDA"), it is possible to use more semiconductor laser array devices (LDA, LDA', LDA") according to the configuration method shown in FIG. 12 or FIG. 15.

In addition, the structure shown in FIG. 15 is suitable when a white color first light emission region (Gs), on which color synthesized is performed, is formed by using the R-G-B three primary color coherent light source, or a coherent light source is driven in a time dividing manner in an order of R-G-B, based on the structure, thereby forming a first light emission region (Gs) of color sequence, wherein each of the semiconductor laser array devices (LDA, LDA', LDA") can be arranged so as to correspond to each color of R-G-B.

Figure 16:
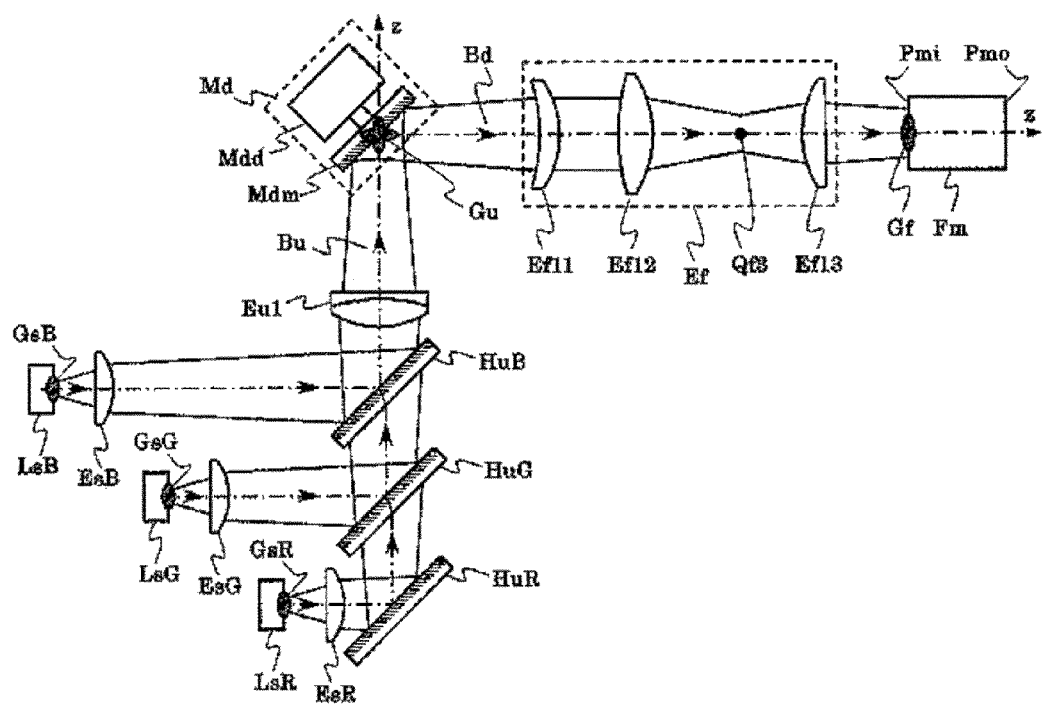
FIG. 16 is a schematic diagram showing one form of an embodiment of a coherent light source apparatus.

FIG. 16 shows a diagram of the structure wherein the first light emission region (Gs) for every color is formed, and light is sent to a first optical system (Eu) using a color synthesis unit such as a dichroic mirror, so that the first light emission region (Gs) where color synthesis is carried out, is formed. The optical system shown in this figure is different from the optical system explained above referring to FIG. 10, in that part, which is upstream of the imaging lens (Eu1) of a first optical system (Eu), is changed.

A radiant section of diverging light, which exists in a surface of the semiconductor chip in the respective semiconductor laser light source units (LsR, LsG, LsB) of color of R-G-B, is represented as a first light emission region (GsR, GsG, GsB), and the color synthesis of the light flux, which is changed into an image at infinity by the collimating lens (EsR, EsG, EsB), is carried out, using a mirror (HuR) and dichroic mirrors (HuG, HuB), so as to be inputted into an imaging lens (Eu1). The action of the imaging lens (Eu1) and that of the downstream optical system are the same as those shown in FIG. 10. Of course, part of the optical system, which is upstream of the imaging lens (Eu1) shown in FIG. 16, can be also applied to the coherent light source apparatus shown in FIG. 11.

Although in the above explanation, the first light emission region (Gs) and first light emission regions (GsR, GsG, GsB) in the coherent light source apparatus shown in FIGS. 10, 11 and 16, are formed by a semiconductor laser light source unit, they may be replaced with the first light emission region (Gs), which is formed by the emission end (Pto) of the optical fiber (Fb), where light of a coherent light source (Sc), as shown in FIG. 8 or FIG. 9, is inputted from the incident end.

Although the optical guide and the fly eye integrator are described as the light mixing unit (Fm) in this specification, as described above, other devices may be applied, as long as these device can mix an angle component and a position component of incident light. In that case, in order not to decrease the light use efficiency, it is advantageous to select a device, which does not increase the angle of the light rays with respect to an optical axis. Although, for example, incase where diffusion is utilized, a spotty or patchy pattern of the speckle becomes fine, so that a function for making it difficult to see them is enhanced, since there is a function for shifting the angle distribution of light rays to aside on which an angle is large, cautions are required in use.

Moreover, the above-described optical guide may have not only a simple quadratic prism shape but also, for example, a shape where a quadrangle in a cross section perpendicular to a z axis, i.e., an optical axis, rotates as getting close to a front side thereof on an axis, that is, a shape where a quadratic prism is twisted with respect to the axis, or a shape where although an emission end (Pmo) has a quadrangle, an incident end (Pmi) has a different shape (for example, circular), that is, a shape where as getting close to a front side on an axis, a quadrangle in a section perpendicular to an optical axis changes so that, for example, the shape of the cross section thereof continuously changes from a round shape to a quadrangle through a polygon whose number of sides is larger, whereby mixing is increased and a spotty or patchy pattern of the speckle becomes fine, so that a function for making it difficult to see can be enhanced. However, in the case where the area of a cross section perpendicular to an optical axis decreases as getting close to the front side on the axis, since as light propagates toward a front side, an angle thereof with respect to a side face increases every time it is reflected on a side face, cautions are required in order to shift angle distribution of the rays to a side where the angle is large.

Although in the above-described embodiment, the rotation rocking mirror consisting of the deflection mirror (Mdm) and the mirror rotation motor (Mdd) is given as the light deflection unit (Md) are used as an example, any device can be used therefore, as long as the angle of light flux can be deflected. For example, it is possible to use a rotation non-parallel glass plate where a glass plate whose cross section is wedge shape is rotated, a rotation image rotating prism where a prism (a Dove prism, a trapezoidal prism, a prism in which a deflection face is replaced with a reflective face, etc.) is rotated with respect to an axis, an oscillating mirror which deflects an angle in a back and forth manner, and a galvanometer, etc. Since a device for rotating an optical element such as the rotation rocking mirror, the rotation non-parallel glass plate, or the rotation image rotating prism, can reduce mechanical vibration, compared with those having a structure for deflecting an angle in a back and forth manner, they are suitable among them as a light deflection unit according to the present invention.

Moreover, since they rock as if a trajectory in a deflection direction draws a circular conical face with rotation of the optical element, even if the light use efficiency decreases according to a deflection in, for example, a light mixing unit (Fm) or a downstream part thereof, the deflection angle with respect to a central axis is constant in case there is no deflection, so that there is an advantage that the phenomenon in which the light use efficiency changes depending on the deflection angle, hardly arises. In contrast to this, in the case where an angle is deflected in a back and forth manner, since a mechanical vibration tends to be large, and in addition the light use efficiency is high at a center of a deflection whereby that the light use efficiency decreases as a deflection angle increases toward the outside from a center of deflection, that is, the drawback that the phenomenon where the light use efficiency changes, that tends to arise, cautions are required.

As generally known in the field of lens design, it is also possible to change the structure of an optical system which is made up of one lens, to that of an optical system which is made up of combination of two or more lenses having the same function thereas, or to change it to a reverse structure. Especially, even when the focal distance of an object optical system is the same, the structure change is used in order that a function, which cannot be physically achieved by one lens, can be realized by setting an input side principal point position and an output side principal point position set to a convenient position or adopting an afocal system, or in order that the aberration is decreased by distributing lens power to two or more lenses. Although in the above-described embodiment, a first optical system (Eu) and a second optical system (Ef) are configured as a combined lens system which is made up of two or more lenses, it is possible to improve performance thereof and cost thereof by utilizing the above-described structure change, or by increasing or decreasing the number of lenses using an aspheric lens.

Moreover, as a result of the structure change, although, for example, the entrance pupil (Qf3), which is described above with respect to FIG. 10, or the conjugate image (Nu) or the conjugate image (Nf), which are described above with respect to FIG. 11, are provided inside an optical system, so that it cannot be sometimes checked by placing a screen, there is still no particular problem.

As industrial utility, the present invention can be used in the industry where a coherent light source apparatus, which can be used in an optical device such as a projector, and which uses a coherent light source such as laser etc., is designed and manufactured.

The preceding description has been presented only to illustrate and describe exemplary embodiments of the present coherent light source apparatus and projector. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A coherent light source apparatus comprising:
   a first optical system, which comprises a first light emission region formed by a coherent light source, wherein light is projected from the first light emission region to form a second light emission region;
   a light deflection unit, that deflects light flux relating to formation of the second light emission region near the second light emission region;
   a second optical system, that is disposed downstream of the light deflection unit and forms a third light emission region that is conjugate to the second light emission region; and
   a light mixing unit that is disposed downstream of the second optical system, the light mixing unit mixes components of an angle and a position of an incident light, wherein an incident end of the light mixing unit is provided near the third light emission region,
   wherein the light deflection unit is configured to perform an operation for continuously changing a direction in which the light flux is deflected.

2. The coherent light source apparatus according to claim 1, wherein the light mixing unit is an optical guide that guides light waves while confining the light in a predetermined space and carrying out multiple reflections of the light.

3. The coherent light source apparatus claim 1, wherein the light mixing unit is a fly eye integrator.

4. The coherent light source apparatus according to claim 1, wherein the first light emission region comprises radiant points, wherein principal rays of a light flux of the light form the respective radiant points, and wherein the principal rays are approximately in parallel after passing through the second optical system.

5. The coherent light source apparatus according to claim 2, wherein the first light emission region comprises radiant points, wherein principal rays of a light flux of the light form the respective radiant points, and wherein the principal rays are approximately in parallel after passing through the second optical system.

6. The coherent light source apparatus according to claim 1, wherein the first light emission region comprises radiant points, wherein principal rays of a light flux of the light form the respective radiant points, and wherein the principal rays pass through near a center of the third light emission region after passing through the second optical system.

7. The coherent light source apparatus according to claim 2, wherein the first light emission region comprises radiant points, wherein principal rays of a light flux of the light form the respective radiant points, and wherein the principal rays pass through near a center of the third light emission region after passing through the second optical system.

8. The coherent light source apparatus according to claim 3, wherein the first light emission region comprises radiant points, wherein principal rays of a light flux of the light form the respective radiant points, and wherein the principal rays pass through near a center of the third light emission region after passing through the second optical system.

9. The coherent light source apparatus according to claim 1, wherein the first light emission region comprises radiant points that are arranged or distributed so that a shape of the third light emission region fits in a shape of the incident end of the light mixing unit.

10. The coherent light source apparatus according to claim 2, wherein the first light emission region comprises radiant points that are arranged or distributed so that a shape of the third light emission region fits in a shape of the incident end of the light mixing unit.

11. The coherent light source apparatus according to claim 4, wherein the first light emission region comprises radiant points that are arranged or distributed so that a shape of the third light emission region fits in a shape of the incident end of the light mixing unit.

12. The coherent light source apparatus according to claim 1, wherein the first light emission region is formed by an emission end of an optical fiber at a location where the light of the coherent light source is inputted from an incident end of the optical fiber.

13. A projector, wherein an image is projected and displayed using the coherent light source apparatus according claim 1, and wherein a light homogenizing unit of the projector serves as the light mixing unit of the coherent light source apparatus.

* * * * *